(12) United States Patent
Bekku

(10) Patent No.: US 11,327,134 B2
(45) Date of Patent: May 10, 2022

(54) MRI APPARATUS, IMAGE PROCESSING APPARATUS, AND IMAGE PROCESSING METHOD

(71) Applicant: CANON MEDICAL SYSTEMS CORPORATION, Otawara (JP)

(72) Inventor: Mitsuhiro Bekku, Utsunomiya (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 58 days.

(21) Appl. No.: 16/830,365

(22) Filed: Mar. 26, 2020

(65) Prior Publication Data
US 2020/0309884 A1 Oct. 1, 2020

(30) Foreign Application Priority Data

Mar. 29, 2019 (JP) .................................. 2019-068938

(51) Int. Cl.
*G01V 3/00* (2006.01)
*G01R 33/48* (2006.01)
*G01R 33/565* (2006.01)
*G01R 33/56* (2006.01)

(52) U.S. Cl.
CPC ..... *G01R 33/4828* (2013.01); *G01R 33/5608* (2013.01); *G01R 33/56554* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| 4,949,042 A | * | 8/1990 | Kuhara | .............. | G01R 33/4828 |
| | | | | | 324/309 |
| 2014/0125844 A1 | * | 5/2014 | Sumitomo | ................ | G06T 7/73 |
| | | | | | 348/231.99 |
| 2015/0355303 A1 | * | 12/2015 | Kuhara | .............. | G01R 33/5611 |
| | | | | | 324/322 |

OTHER PUBLICATIONS

Berglund et al., "Two-point Dixon Method With Flexible Echo Times", Magnetic Resonance in Medicine 65, 2011, pp. 994-1004.

* cited by examiner

*Primary Examiner* — Walter L J Lindsay R
*Assistant Examiner* — Frederick Wenderoth
(74) *Attorney, Agent, or Firm* — Oblon, McClelland, Maier & Neustadt, L.L.P.

(57) ABSTRACT

In one embodiment, an MRI apparatus includes: a scanner for acquiring MR signals from an imaging region in which substances having different magnetic resonance frequencies are included; and processing circuitry. The processing circuitry is configured to: calculate phase correction data, which includes information on phase rotation amount due to non-uniformity of a static magnetic field, from MR signals; generate an image by using the phase correction data and the MR signals such that a signal from at least one of the substances in the imaging region is suppressed in the image; and perform decimation processing on first phase correction data to generate second phase correction data, based on information related to a component ratio of the plurality of substances in the imaging region and a plurality of MR signals, wherein resolution of the second phase correction data is lower than the first phase correction data.

18 Claims, 15 Drawing Sheets

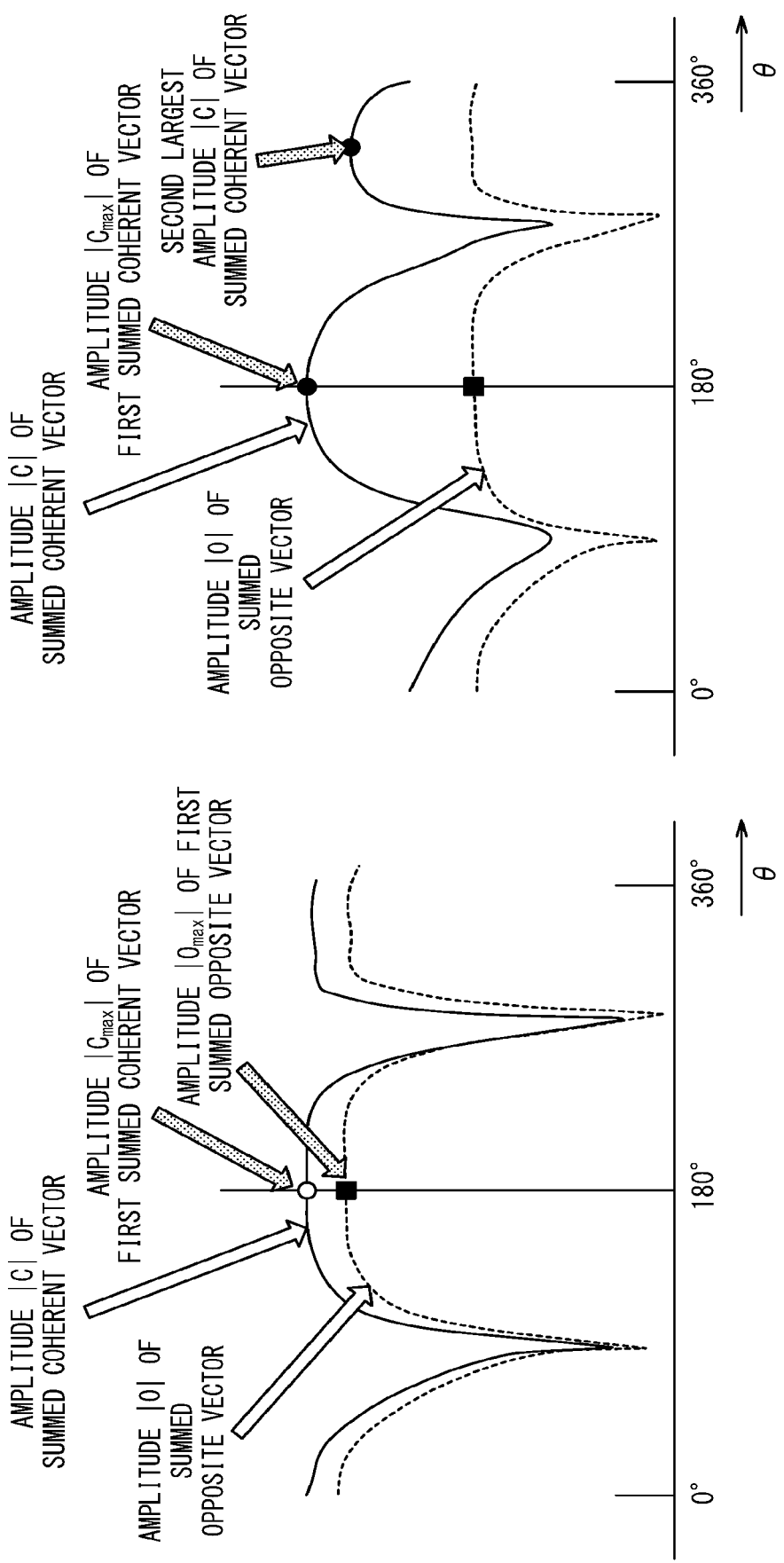

MRI APPARATUS, IMAGE PROCESSING APPARATUS, AND IMAGE PROCESSING METHOD

CROSS-REFERENCE TO RELATED APPLICATION

This application is based upon and claims the benefit of priority from Japanese Patent Application No. 2019-068938, filed on Mar. 29, 2019, the entire contents of which are incorporated herein by reference.

FIELD

Disclosed Embodiments relate to a magnetic resonance imaging (MRI) apparatus, an image processing apparatus, and an image processing method.

BACKGROUND

An MRI apparatus is an imaging apparatus which magnetically excites nuclear spin of an object placed in a static magnetic field with a radio frequency (RF) having the Larmor frequency and reconstructs an image based on the magnetic resonance (MR) signals emitted from the object due to the excitation.

Among MRI techniques, a Dixon method is known. In the Dixon method, for example, the water image and the fat image are generated from a plurality of images obtained by reconstructing data that are acquired at different echo times TE. For example, from a first image corresponding to a first echo time and a second image corresponding to a second echo time, the water image and the fat image are generated. In the water image, the fat component of the object is suppressed, while, in the fat image, the water component of the object is suppressed.

The phase of each pixel value of the first image and the second image is affected by non-uniformity of a static magnetic field. Thus, when generating the water image and the fat image from the first image and the second image, it is important to correctly estimate the influence of the non-uniformity of the static magnetic field.

For this reason, various techniques have been conventionally developed, by which the effect of the non-uniformity of the static magnetic field is correctly estimated such that the water image and the fat image are accurately calculated. Among such techniques, a technique called a TRW-S (sequential tree-reweighted message-passing) algorithm is known.

In the TRW-S algorithm, the effect of the non-uniformity of the static magnetic field is accurately estimated, by using an assumption that the static magnetic field, if at all, should change continuously and smoothly.

However, even when the TRW-S algorithm is used, the effect of the non-uniformity of the static magnetic field may be erroneously estimated in some cases. If the effect of the non-uniformity of the static magnetic field is erroneously estimated, it may cause so-called a "swap". In the swap event, part of the region that should be depicted as the water component in the water image is erroneously swapped (i.e., replaced or exchanged) with the fat component, or conversely, part of the region that should be depicted as the fat component in the fat image is erroneously swapped with the water component.

BRIEF DESCRIPTION OF THE DRAWINGS

In the accompanying drawings:

FIG. 13A is a schematic diagram illustrating the amplitude |C| of the summed coherent vector and the amplitude |O| of the summed opposite vector when $|O_{max}|/|C_{max}|$ indicates a large value close to 1;

FIG. 13B is a schematic diagram illustrating the amplitude |C| of the summed coherent vector and the amplitude 101 of the summed opposite vector when $|O_{max}|/|C_{max}|$ is determined to be smaller than a predetermined value and the number of peaks of the summed coherent vector is determined to be two or more;

DETAILED DESCRIPTION

Hereinafter, respective embodiments of an MRI apparatus, an image processing apparatuses, and an image processing method will be described by referring to the accompanying drawings. In the following embodiments, components denoted by the same reference signs are assumed to be the same in terms of function and configuration, and duplicate description is omitted.

(MRI Apparatus)

In at least one embodiment, an MRI apparatus includes: a scanner configured to acquire a plurality of MR signals at respective different echo times from an imaging region of an object, the imaging region including a plurality of substances that are different in magnetic resonance frequency from each other; and processing circuitry. The processing circuitry is configured to: calculate phase correction data from the plurality of MR signals, the phase correction data including information on phase rotation amount due to non-uniformity of a static magnetic field; and generate an image by using the phase correction data and the plurality of MR signals in such a manner that a signal from at least one of the plurality of substances is suppressed in the image. The processing circuitry is further configured to perform decimation processing on first phase correction data to generate second phase correction data, based on information related to a component ratio of the plurality of substances in the imaging region and a plurality of MR signals, wherein resolution of the second phase correction data is lower than the first phase correction data, and the first phase correction data are calculated form the plurality of MR signals.

Figure 1:
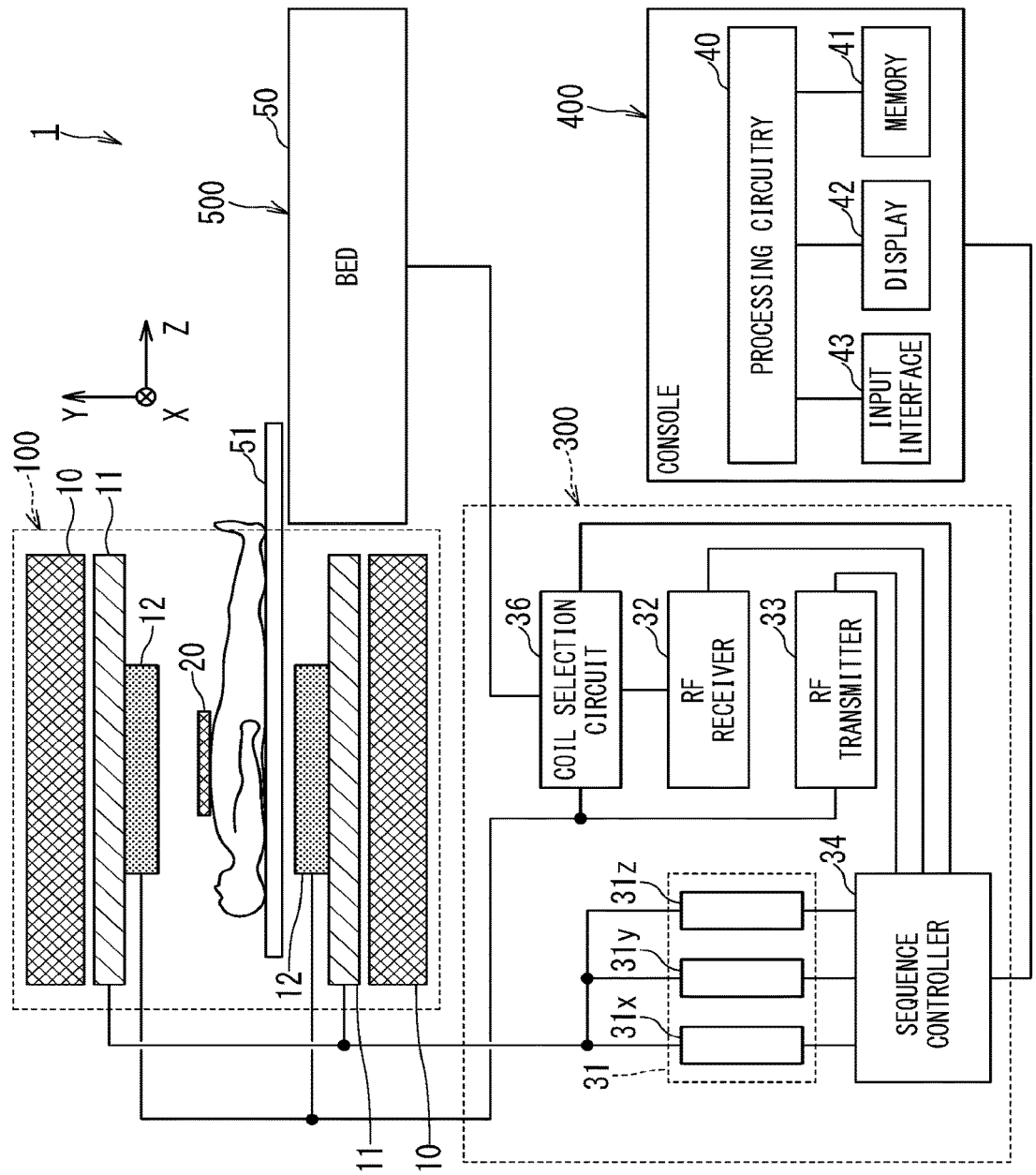
FIG. 1 is a block diagram illustrating an overall configuration of the MRI apparatus of the first embodiment.

FIG. 1 is a block diagram illustrating the overall configuration of the MRI apparatus 1 of the present embodiment. The MRI apparatus 1 includes a gantry 100, a control cabinet 300, a console 400, a bed 500, and an RF (Radio Frequency) coil 20.

The gantry 100 includes a static magnetic field magnet 10, a gradient coil assembly 11, and a whole body (WB) coil 12, and these components are housed in a cylindrical housing. The bed 500 includes a bed body 50 and a table 51.

The control cabinet 300 includes three gradient coil power supplies 31 (31x for an X-axis, 31y for a Y-axis, and 31z for a Z-axis), a coil selection circuit 36, an RF receiver 32, an RF transmitter 33, and a sequence controller 34.

The console 400 includes processing circuitry 40, a memory 41, a display 42, and an input interface 43. The console 400 functions as a host computer.

The static magnetic field magnet 10 of the gantry 100 is substantially in the form of a cylinder, and generates a static magnetic field inside a bore, which is a space formed inside the cylindrical structure and serves as an imaging region of the object (for example, a patient). The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current to be provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year.

The gradient coil assembly 11 is also substantially in the form of a cylinder and is fixed to the inside of the static magnetic field magnet 10. The gradient coil assembly 11 includes an X-axis gradient coil, a Y-axis gradient coil, and a Z-axis gradient coil.

The bed body 50 of the bed 500 can move the table 51 in the vertical direction and in the horizontal direction. The bed body 50 moves the table 51 with the object placed thereon to a predetermined height before imaging. Afterward, when the object is imaged, the bed body 50 moves the table 51 in the horizontal direction so as to move the object to the inside of the bore.

The WB body coil 12 is shaped substantially in the form of a cylinder so as to surround the object, and is fixed to the inside of the gradient coil assembly 11. The WB coil 12 applies RF pulses to be transmitted from the RF transmitter 33 to the object, and receives MR signals emitted from the object due to excitation of hydrogen nuclei.

The MRI apparatus 1 includes an RF coil 20 in addition to the WB coil 12 as shown in FIG. 1. The RF coil 20 (i.e., surface coil) is a coil to be placed close to the body surface of the object. The RF coil 20 includes a plurality of coil elements. Since the plurality of coil elements are arranged in an array inside the RF coil 20, they are also called a PAC (Phased Array Coil). Depending on the anatomical imaging part of the object, there are various RF coils 20. For example, the various RF coils 20 include: a body coil to be attached on the chest, abdomen, or legs of the object as shown in FIG. 1; and a spine coil to be attached on the back of the object.

The RF transmitter 33 generates an RF pulse on the basis of an instruction from the sequence controller 34. The generated RF pulse is transmitted to the WB coil 12 and applied to the object. An MR signal is generated from the object by the application of the RF pulse. The RF coil 20 or the WB coil 12 receives this MR signal.

The MR signal received by the RF coil 20, more specifically, the MR signal received by each element coil in the RF coil 20 is transmitted to the coil selection circuit 36 via a cable provided on the table 51 and the bed body 50. The coil selection circuit 36 selects a signal outputted from the RF coil 20 or a signal outputted from the WB coil depending on a control signal outputted from the sequence controller 34 or the console 400.

The selected signal is outputted to the RF receiver 32.

The RF receiver 32 performs A/D (Analog to Digital) conversion on the channel signal, i.e., the MR signal, and outputs the digitized MR signals to the sequence controller 34. The digitized MR signals are called raw data in some cases. Note that the A/D conversion may be performed inside the RF coil 20 or in the coil selection circuit 36.

The sequence controller 34 performs a scan of the object by driving the gradient coil power supplies 31, the RF transmitter 33, and the RF receiver 32 under the control of the console 400. When the sequence controller 34 receives the raw data from the RF receiver 32 by performing the scan, the sequence controller 34 transmits the received raw data to the console 400.

The sequence controller 34 includes processing circuitry (not shown). This processing circuitry is configured as, for example, a processor for executing predetermined programs or configured as hardware such as a field programmable gate array (FPGA) and an application specific integrated circuit (ASIC).

The console 400 includes a memory 41, an input interface 43, a display 42, and processing circuitry 40. The memory 41 is a recording medium including a read-only memory (ROM) and a random access memory (RAM) in addition to an external memory device such as a hard disk drive (HDD) and an optical disc device. The memory 41 stores various programs to be executed by a processor of the processing circuitry 40 as well as various data and information.

The input interface 43 includes various devices for an operator to input various data and information, and is configured of, for example, a mouse, a keyboard, a trackball, and/or a touch panel.

The display 42 is a display device such as a liquid crystal display panel, a plasma display panel, and an organic EL panel.

The processing circuitry 40 is, for example, a circuit provided with a central processing unit (CPU) and/or a special-purpose or general-purpose processor. The processor implements various functions described below by executing the programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

In the configuration of the MRI apparatus 1 shown in FIG. 1, the control cabinet 300, the gantry 100, and the bed 500 (i.e., all the components except the console 400) constitute an imaging unit. The imaging unit is also referred to as a scanner.

The MRI apparatus 1 of the present embodiment executes an imaging method or image processing method called a Dixon method.

Figure 2:
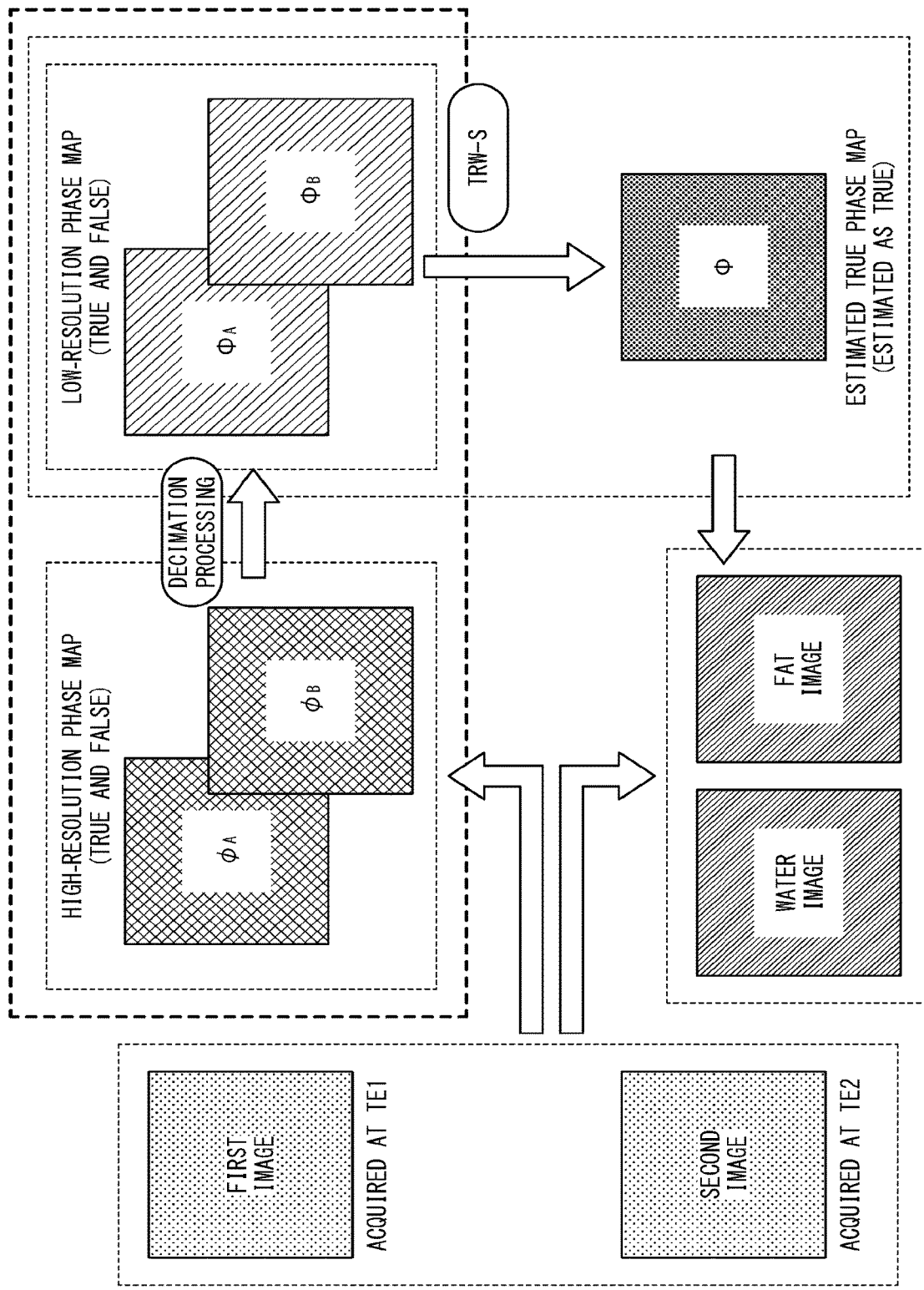
FIG. 2 is a schematic diagram illustrating an overall outline of the Dixon method to be performed by the MRI apparatus of the present embodiment.

FIG. 2 is a schematic diagram illustrating an overall outline of the Dixon method executed by the MRI apparatus 1 of the present embodiment.

As mentioned above, in the Dixon method, for example, the water image and the fat image are generated from a plurality of images obtained by reconstructing data that are acquired at different echo times TE. For example, from a first image corresponding to a first echo time and a second image corresponding to a second echo time, two images, i.e., the water image and the fat image are generated, in each of which water and fat are separated from each other. In the water image, the fat component of the object is suppressed, while, in the fat image, the water component of the object is suppressed.

Hereinafter, a description will be given of the so-called two-point Dixon method in which the water image and the fat image are generated from two images, i.e., the first image and the second image.

However, the present embodiment is not limited to the two-point Dixon method but can be extended to a so-called multipoint Dixon method in which a water image and a fat image are generated by using three or more images corresponding to respective three or more echo times.

In the Dixon method, by using the fact that the water component and the fat component in each tissue in the imaging region are different in magnetic resonance frequency, a water image, in which the fat component is suppressed is generated, or a fat image, in which a water component is suppressed, is generated. However, the substances to be processed by the Dixon method are not limited to water and fat. When a plurality of substances included in the imaging region have different magnetic resonance frequencies, these substances can be separated by using the Dixon method. In this case, the MRI apparatus 1 of the present embodiment can generate an image in which signals from at least one of the plurality of substances are suppressed. The following description, however, will be given of the case where the substances to be processed are a water component and a fat component, from the viewpoint of simplicity.

The phase of each pixel value of the first image and the second image is affected by the non-uniformity of the static magnetic field. Thus, when calculating the water image and the fat image from the first image and the second image, it is important to correctly estimate the effect of the non-uniformity of the static magnetic field.

The complex pixel value $S_1$ of the first image and the complex pixel value $S_2$ of the second image are affected by the phase $\varphi$ caused by the static-magnetic-field non-uniformity AB. As described below, the phase $\varphi$ can be obtained by solving an equation including known parameters such as the complex pixel value $S_1$ of the first image, the complex pixel value $S_2$ of the second image, and the echo times TE1 and TE2 corresponding to the respective images. However, since this equation is a quadratic equation, the solutions of this quadratic equation yield two phases $\varphi_A$ and $\varphi_B$, which correspond to positive and negative signs, respectively.

The phase $\varphi_A$ and the phase $\varphi_B$ are calculated as a pair, one of which is a true phase and the other is a false phase. Since the pair of the phase $\varphi_A$ and the phase $\varphi_B$ are calculated for each pixel of the first image and the second image, a set of phases $\varphi_A$ can be represented as a phase map $\varphi_A$ by arranging the phases $\varphi_A$ at corresponding pixel positions as shown in the upper center of FIG. 2. Similarly, a set of phases $\varphi_B$ can be represented as a phase map $\varphi_B$ by arranging the phases $\varphi_B$ at corresponding pixel positions.

In order to correctly determine the non-uniformity of the static magnetic field, it is necessary to correctly determine which of the phase $\varphi_A$ and the phase $\varphi_B$ is true and which is false, and determine one of the phases $\varphi_A$ and $\varphi_B$ as the true phase $\varphi$.

In the TRW-S algorithm, as mentioned above, the effect of the non-uniformity of the static magnetic field is accurately estimated, by using an assumption that the static magnetic field, if at all, should change continuously and smoothly. Non-Patent Document 1 discloses a conventional TRW-S algorithm in detail.

[Non-Patent Document 1] Johan Berglund et al., Two-point Dixon Method With Flexible Echo Times, MRM 65:994-1004 (2011)

In the Non-Patent Document 1, prior to execution of the TRW-S algorithm, pixel/voxel decimation processing (i.e., processing of reducing resolution, hereinafter, simply referred to as the decimation processing) is performed on the phase map $\varphi_A$ and the phase map $\varphi_B$ in order to reduce the processing load. Further, as shown in the right part of FIG. 2, the TRW-S algorithm is applied to the phase map $\Phi_A$ and phase map $\Phi_B$, both of which have been subjected to the decimation processing, to obtain a true phase map.

However, even if the TRW-S algorithm described in Non-Patent Document 1 is applied, the true phase may still be erroneously estimated. That is, the false phase may be erroneously selected as the true phase from the phase $\Phi_A$ and the phase $\Phi_B$. If the false phase is erroneously selected as the true phase, and then a water image and a fat image are generated by using the selected phase, it may cause a swap event. In the swap event, part of the region that should be depicted as the water component in the water image is erroneously swapped with the fat component, or conversely, part of the region that should be depicted as the fat component in the fat image is erroneously swapped with the water component.

As the factors of causing the swap event between the water component and the fat component, an internal factor of the TRW-S algorithm and an external factor of the TRW-S algorithm are conceivable. It is conceivable that, prior to the application of the TRW-S algorithm, the external factor may be generated during a process of the decimation processing, in which the resolution of the phase maps $\Phi_A$ and $\Phi_B$ is reduced. For example, it is conceivable that the true phase and the false phase are exchanged with each other, or are improperly combined, during the decimation processing. In this case, consequently, the phase $\Phi_A$ and the phase $\Phi_B$ after the decimation processing become incorrect values, which causes the swap event between the water component and the fat component.

Figure 3:
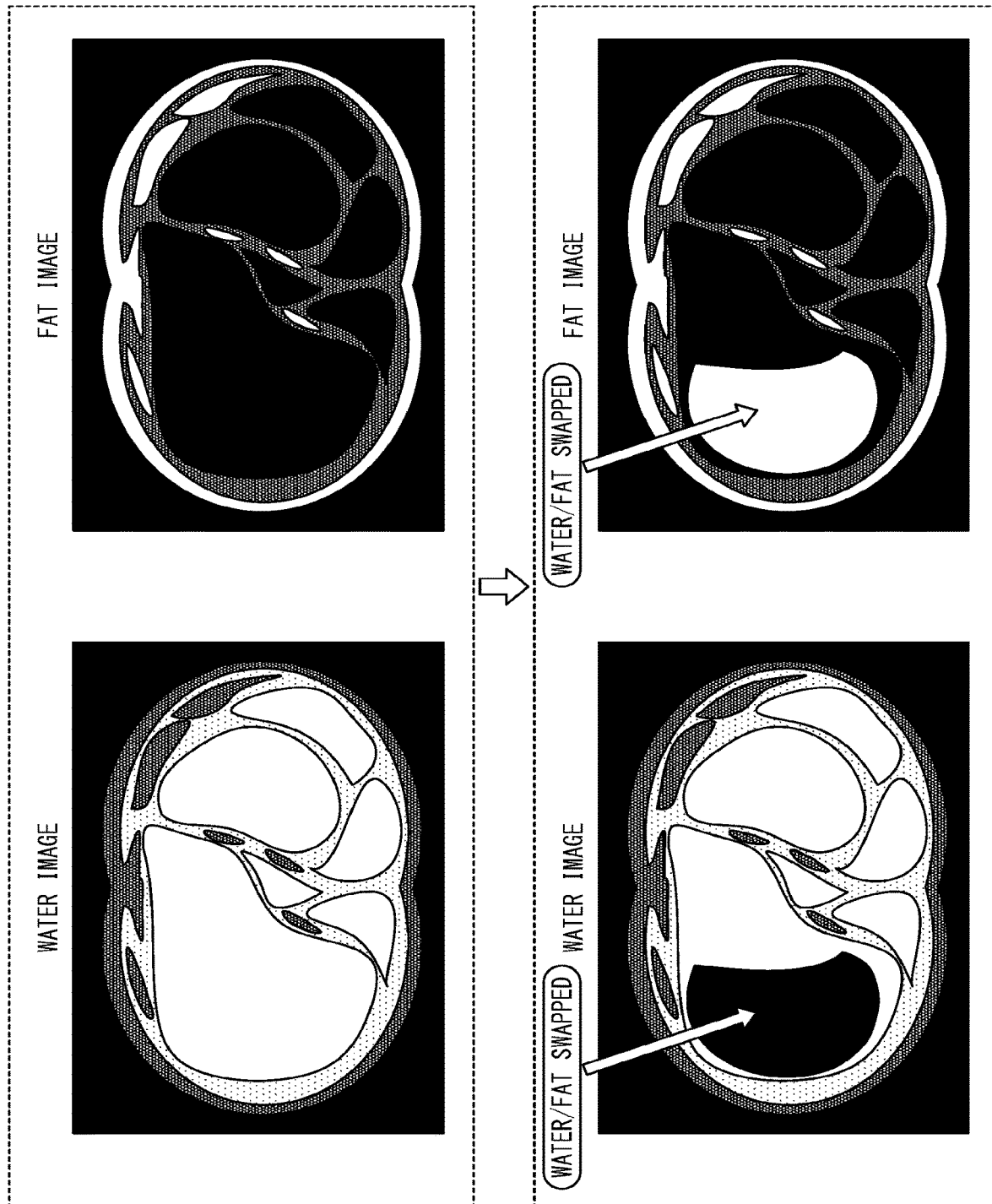
FIG. 3 is a schematic diagram illustrating a water image and a fat image when a water region and a fat region are swapped with each other.

FIG. 3 is a schematic diagram illustrating a water image and a fat image when a water region and a fat region are swapped with each other. FIG. 3 schematically shows an example of an axial cross-section including the liver. The upper part of FIG. 3 illustrates a correct water image and a correct fat image, in both of which the water region and the fat region are not swapped. The lower part of FIG. 3 illustrates an incorrect water image and an incorrect fat image which are erroneously generated as a result of the swap event between the water region and the fat region.

The MRI apparatus 1 of the present embodiment deals with such a swap event between the water region and the fat region. In particular, the MRI apparatus 1 of the present embodiment provides a more advanced TRW-S algorithm than the conventional TRW-S algorithm for suppressing the swap event between the water region and the fat region.

Figure 4:
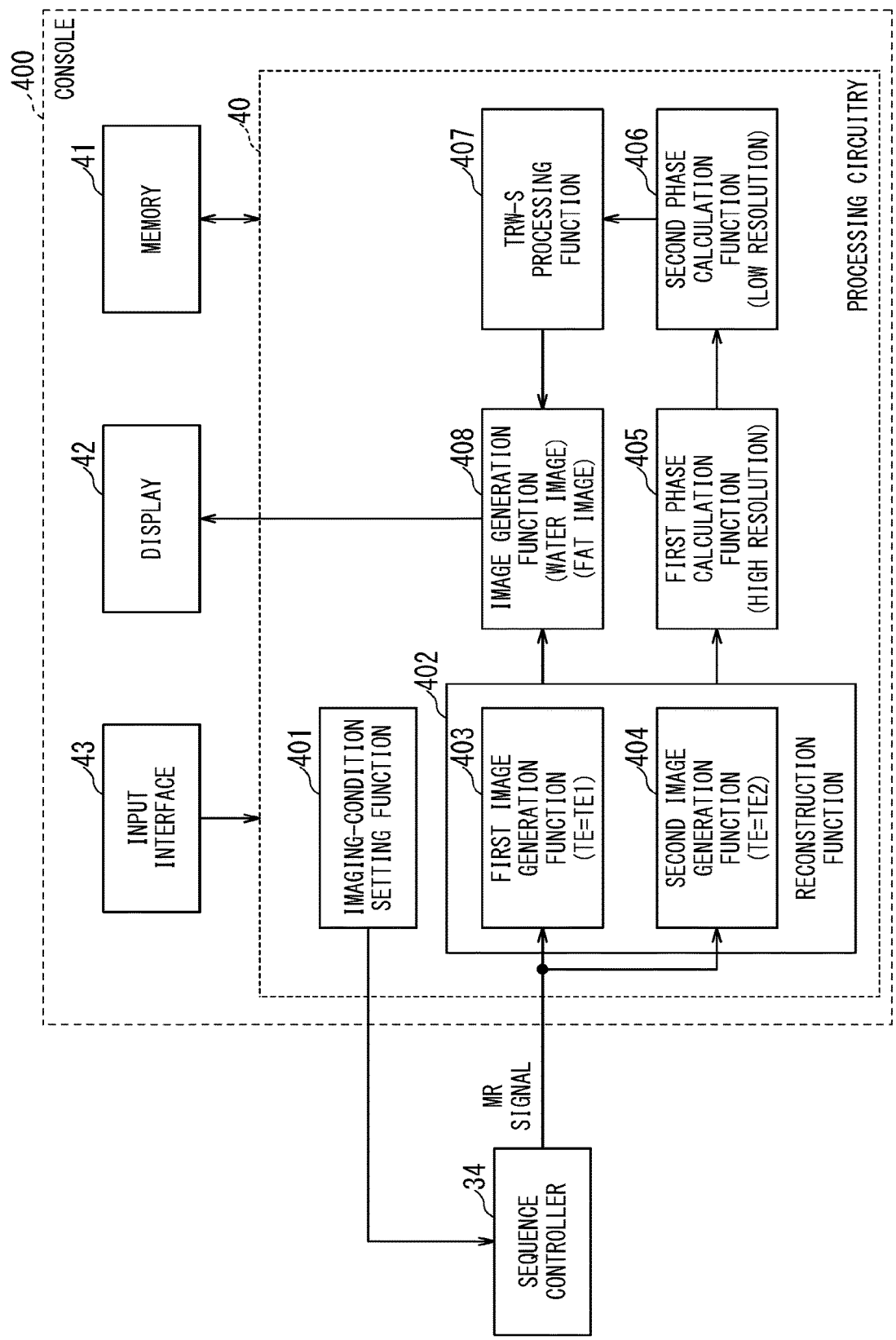
FIG. 4 is a block diagram illustrating a functional configuration of the MRI apparatus of the present embodiment.

FIG. 4 is a functional block diagram of the processing circuitry 40 focusing on the processing function of the Dixon method according to the present embodiment.

Figure 5:
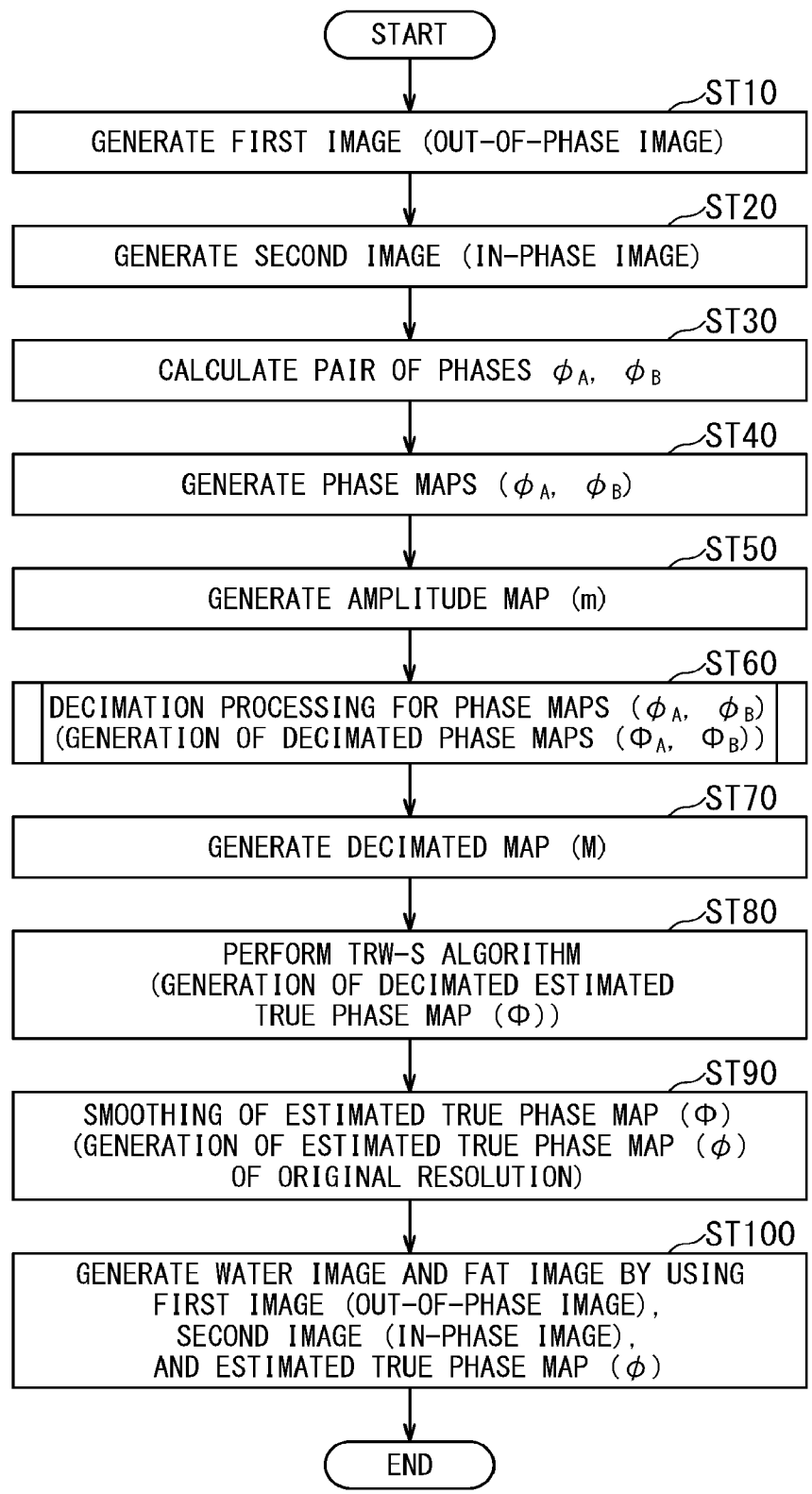
FIG. 5 is a flowchart illustrating an operation to be performed by the MRI apparatus of the present embodiment.

FIG. 5 is an overall flowchart for illustrating an operation executed by the MRI apparatus 1.

As shown in FIG. 4, the processing circuitry 40 of the console 400 implements an imaging-condition setting function 401, a reconstruction function 402, a first-image (TE=TE1) generation function 403, a second-image (TE=TE2) generation function 404, a first-phase calculation function 405, a second-phase calculation function 406, a TRW-S processing function 407, and an image generation function 408. For example, the processing circuitry 40 implements each of these functions by causing its processor to execute predetermined programs stored in the memory 41. The operation of each of these functions will be described by referring to the overall flowchart of FIG. 5. In particular, the second-phase calculation function 406 for implementing the decimation processing will be described in detail by referring to a series of flowcharts composed of FIG. 7, FIG. 9, FIG. 11, and FIG. 12 and some related drawings.

First, in the step ST10 of FIG. 5, the first image is generated. In the step ST20, the second image is generated. Specifically, the imaging-condition setting function 401 shown in FIG. 4 sets a first pulse sequence for generating the first image, and the first-image generation function 403 performs predetermined processing on the MR signals acquired by execution of the first pulse sequence so as to reconstruct the first image. Similarly, the imaging-condition setting function 401 sets a second pulse sequence for generating the second image, and the second-image generation function 404 performs predetermined processing on the MR signals acquired by execution of the second pulse sequence so as to reconstruct the second image.

Between the first and second pulse sequences, the echo time TE is set to a different value, whereas the type of pulse sequence is basically set to be the same and all the parameters of the pulse sequence except the echo time TE are set to be basically the same. Each of the first and second pulse sequences may be a SE (Spin Echo) pulse sequence or a GRE (Gradient Echo) pulse sequence.

The echo time of the first pulse sequence is set to TE1, and the echo time of the second pulse sequence is set to TE2. As is well known, the water component and the fat component are different in magnetic resonance frequency (for example, both are separated by about 3.5 ppm). When the echo times TE are different, the phase rotation amount of the water component and the phase rotation amount of the fat component are different. When the respective echo times TE1 and TE2 of the first and second pulse sequence are set such that the phases of the water component and the fat component are opposite to each other, an image generated from MR signals acquired by these first and second pulse sequence is called an Out-of-Phase image. On the other hand, when the respective echo times TE1 and TE2 of the first and second pulse sequence are set such that the phases of the water component and the fat component are in phase, an image generated from MR signals acquired by these first and second pulse sequence is called an In-Phase image.

In order to generate a water image and a fat image, it is sufficient if the echo times TE1 and TE2 are known, and it is not necessarily required that one of the first and second images is an Out-of-Phase image and the other is an In-Phase image. Note that, however, for facilitating understanding, a description will be given of the case where the first image is an Out-of-Phase image and the second image is an In-Phase image, hereafter. Further, note that most of equations or expressions used in the following are cited from the Non-Patent Document 1.

The process of calculating the phase $\varphi_A$ and the phase $\varphi_B$ from the first image and the second image will be described below. When each pixel value (complex number) of the first image is denoted as $S_1$ and each pixel value (complex number) of the second image is denoted as $S_2$, the pixel values $S_1$ and $S_2$ can be represented by Expressions 1 and 2 below.

$$S_1 = (W + a_1 F) b_0 \qquad \text{Expression 1}$$

$$S_2 = (W + a_2 F) b_0 b \qquad \text{Expression 2}$$

In Expressions 1 and 2, "W" is a signal value (real number) when the echo time TE for water is zero, and "F" is a signal value (real number) when the echo time TE for fat is zero.

The symbol "$b_0$" is a phase term ($b_0 = \exp(j\varphi_0)$) when the phase of the water signal in the case of TE=TE1 is defined as $\varphi_0$. The symbol "b" is a phase term ($b = \exp(j\varphi)$) when $\varphi$ is defined as a phase that rotates mainly due to non-uniformity of the static magnetic field during the time $\Delta T$ ($\Delta T = TE2 - TE1$) between the echo times TE2 and TE1. The parameters $a_1$ and $a_2$ are represented by Expressions 3 and 4 below.

$$a_1 = \exp(-j 2\pi \gamma B_0 \delta TE_1) \qquad \text{Expression 3}$$

$$a_2 = \exp(-j 2\pi \gamma B_0 \delta TE_2) \qquad \text{Expression 4}$$

In Expressions 3 and 4, $\gamma$ is the gyromagnetic ratio, $B_0$ is the static magnetic field strength, $\delta$ is the chemical shift of fat with respect to water (about 3.5 ppm), the echo time TE1 is the time length from the application timing of an excitation pulse (time t is zero) to the peak timing of the echo (time t=TE1) in the first pulse sequence for acquiring the first image, and the echo time TE2 is the time length from the application timing of an excitation pulse (t=0) to the peak timing of the echo (t=TE2) in the second pulse sequence for acquiring the second image. Note that, the parameters $a_1$ and $a_2$ are known parameters determined by parameters of the pulse sequence such as echo time TE, which are set as the imaging conditions.

When Expression 1 and Expression 2 are respectively squared, Expression 5 and Expression 6 below are obtained.

$$|S_1|^2 = W^2 + F^2|a_1|^2 + 2WFRe(a_1) \quad \text{Expression 5}$$

$$|S_2|^2 = W^2 + F^2|a_2|^2 + 2WFRe(a_2) \quad \text{Expression 6}$$

When $Q=F/(W+F)$ is introduced as a fat ratio, Expression 5 and Expression 6 become a quadratic equation of Q. The solution of this quadratic equation is Expression 7 below.

$$Q_{A,B} = \frac{c_1 \pm \sqrt{c_3}}{c_1 + c_2} \quad \text{Expression 7}$$

In Expression 7, c1, c2, and c3 are expressed by Expressions 8 to 10 below.

$$c_1 = |S_1|^2(1-Re(a_2)) - |S_2|^2(1-Re(a_1)) \quad \text{Expression 8}$$

$$c_2 = |S_1|^2(|a_2|^2 - Re(a_2)) - |S_2|^2(|a_1|^2 - Re(a_1)) \quad \text{Expression 9}$$

$$c_3 = |S_1|^2|S_2|^2|a_1 - a_2|^2 - (Im(a_1)|S_2|^2 - Im(a_2)|S_1|^2)^2 \quad \text{Expression 10}$$

Expressions 11 and 12 are obtained from Expressions 1, 2, and 7 as follows.

$$b_A = \frac{S_2(1 + Q_A(a_1 - 1))}{S_1(1 + Q_A(a_2 - 1))} \quad \text{Expression 11}$$

$$b_B = \frac{S_2(1 + Q_B(a_1 - 1))}{S_1(1 + Q_B(a_2 - 1))} \quad \text{Expression 12}$$

The symbols "$b_A$" in Expression 11 and "$b_B$" in Expression 12 are respectively related to the phase $\varphi_A$ and the phase $\varphi_B$ by Expressions 13 and 14 below.

$$b_A = \exp(j\varphi_A) \quad \text{Expression 13}$$

$$b_B = \exp(j\varphi_B) \quad \text{Expression 14}$$

As described above, on the basis of Expression 1 to Expression 14, the phase $\varphi_A$ and the phase $\varphi_B$ can be calculated from the pixel value $S_1$ of the first image, the pixel value $S_2$ of the second image, and the known parameters $a_1$ and $a_2$. Note that the symbols "$b_A$" and "$b_B$" correspond to the respective signs of ± in Expression 7, and similarly, the phases $\varphi_A$ and $\varphi_B$ correspond to the respective signs of ± in Expression 7. One of the phase $\varphi_A$ and the phase $\varphi_B$ is the true phase corresponding to the actual static magnetic field distribution, and the other of the phases $\varphi_A$ and $\varphi_B$ is the false phase.

The computation processing from Expressions 1 to 14 corresponds to the processing of the step ST30 in FIG. 5. The phase $\varphi_A$ is calculated for each pixel value $S_1$ of the first image, and the phase $\varphi_B$ is calculated for each pixel value $S_2$ of the second image. The phase map $\varphi_B$ generated in the step ST40 is obtained by arranging the phases $\varphi_A$ at the corresponding pixel positions, and the phase map $\varphi_B$ generated in the step ST40 is obtained by arranging the phases $\varphi_B$ at the corresponding pixel positions.

In the step ST50, the amplitude m is calculated from the pixel value $S_1$ of the first image and the pixel value $S_2$ of the second image by, for example, Expression 15 below, and then an amplitude map, in which the amplitudes m are arranged at the corresponding pixel positions, is generated.

$$m = |S_1| + |S_2| \quad \text{Expression 15}$$

Instead of Expression 15, the amplitude map may be generated by using only the amplitude of the pixel values of the In-Phase image (second image).

In the step ST60, the phase map $\varphi_A$ and the phase map $\varphi_B$ generated in the step ST40 are subjected to a decimation processing (i.e., reduced in resolution), and a low-resolution phase map $\Phi_A$ and a low-resolution phase map $\Phi_B$ are generated. The decimation processing is performed in order to reduce the processing load of the TRW-S algorithm executed in the step ST80.

Incidentally, before the decimation processing, both the phase $\varphi$ and the phase maps $\varphi_A$, $\varphi_B$ are written in lowercase, and after the decimation processing, the phase $\Phi$ and the phase maps $\Phi_A$, $\Phi_B$ are written in uppercase.

As mentioned above, as the factors of causing the swap event between the water component and the fat component, an internal factor of the TRW-S algorithm and an external factor of the TRW-S algorithm are conceivable. It is conceivable that, prior to the application of the TRW-S algorithm, the external factor may be generated during a process of the decimation processing, in which the resolution of the phase maps $\varphi_A$ and $\varphi_B$ is reduced. For example, it is conceivable that the true phase and the false phase are exchanged with each other, or are improperly combined, during the decimation processing. In this case, consequently, the phase $\Phi_A$ and the phase $\Phi_B$ after the decimation processing become incorrect values, which causes the swap event between the water component and the fat component.

Figure 6:
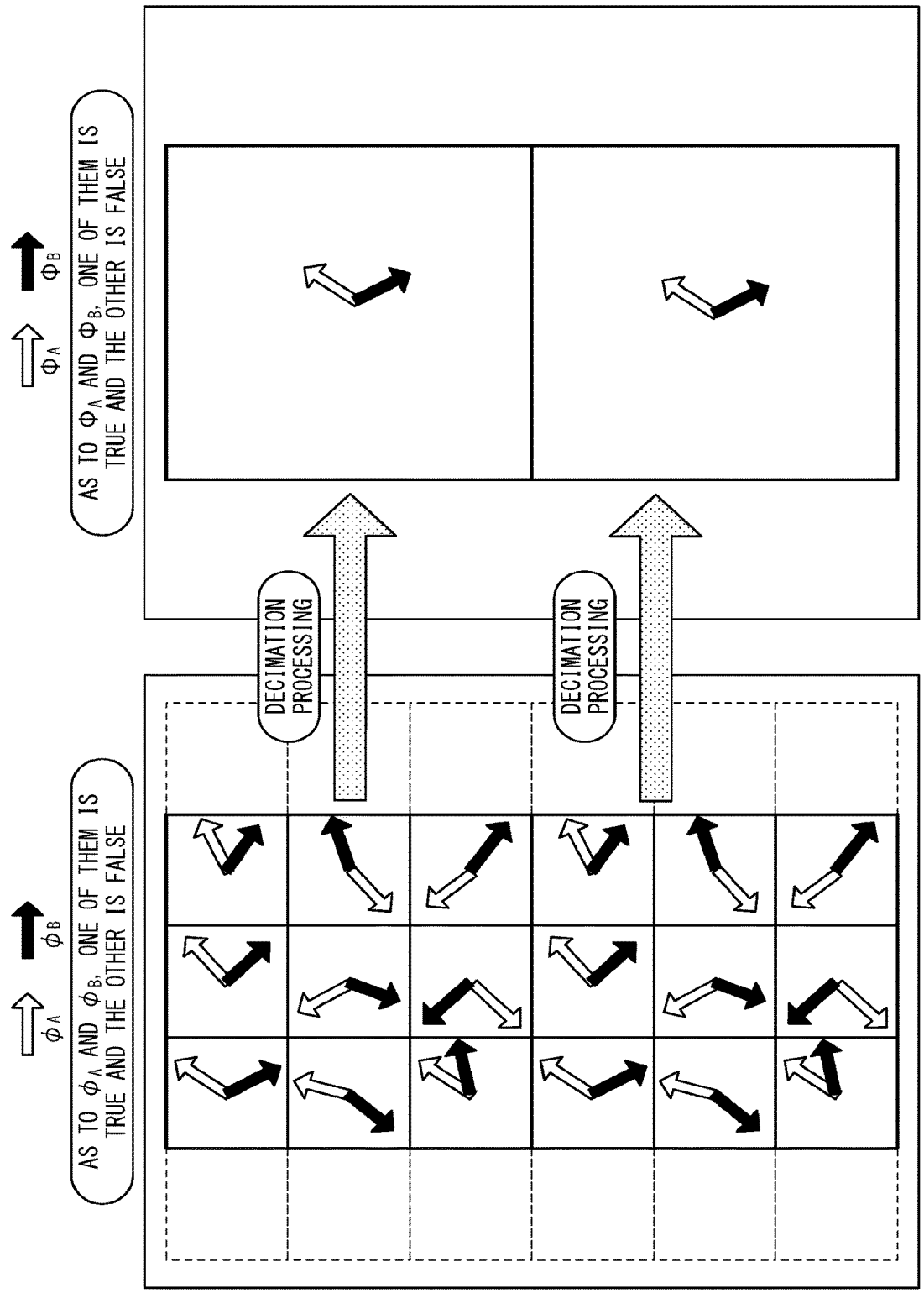
FIG. 6 is a schematic diagram illustrating a concept of decimation processing for the phase map $\varphi_A$ and the phase map $\varphi_B$.

FIG. 6 is a schematic diagram illustrating a concept of the decimation processing applied to the phase map $\varphi_A$ and the phase map $\varphi_B$. In FIG. 6, in the phase map $\varphi_A$ and the phase map $\varphi_B$, the phase $\varphi_A$ and the phase $\varphi_B$ at the same pixel position are respectively represented by a white vector and a black vector, each of which has an amplitude of 1. FIG. 6 shows a case where 3×3 pixels are combined into one pixel by the decimation processing.

In the decimation processing disclosed in Non-Patent Document 1, one of the phases $\varphi_A$ and $\varphi_B$ is selected as a vector for each pixel/voxel. For example, in the case of the nine pixels to be decimated into one pixel in the upper part of FIG. 6, the number of combinations of $\varphi_A$ and $\varphi_B$ is $2^9$ for selecting the vector. Vectors of a plurality of pixels/voxels, which are to be subject to the decimation processing, are weighted by amplitude, then, vector summation is performed on all the combinations of $\varphi_A$ and $\varphi_B$. After that, the phase of the summed vector having the largest (i.e., maximum) amplitude in all the combinations is defined as the decimated phase $\Phi_A$ (i.e., phase $\Phi_A$ after the decimation processing). On the other hand, the decimated phase $\Phi_B$ is defined as the phase of the summed vector of the complimentary combination in which the other one of $\varphi_A$ and $\varphi_B$ is selected for every pixel with respect to the combination of the decimated phase $\Phi A$. For example, when $\varphi_A$ is selected in every pixel in the case of the combination of the decimated phase $\Phi_A$, the phase $\Phi B$ is defined as the phase of the summed vector of the combination in which $\varphi_B$ is selected for every pixel.

However, the method disclosed in Non-Patent Document 1 is not realistic, because the number of combinations will sharply increase when the number of pixels/voxels to be summed increases. For example, when a phase map of 256×256×256 voxels is decimated into a phase map of 64×64×64 voxels, 4×4×4 (=64) voxels are combined into one voxel. In this case, the number of combinations of $\varphi_A$ and $\varphi_B$ is $2^{64}$, and it is impractical to perform a vector summation on all the combinations.

Therefore, in practice, it is unavoidable to take a method of omitting some pixels to be summed. As a result, there is a possibility that the phase $\Phi_A$ and the phase $\Phi_B$ after the decimation processing are erroneously estimated. In addition, as disclosed in Non-Patent Document 1, it is conceivable to stepwise decimate the entire image by separating each pixel group (to be decimated into one pixel) into a plurality of levels. However, in this method, once an erroneous estimation is made at a certain level, the result of the erroneous estimation has an adverse effect on processing at and after the next level.

Accordingly, the MRI apparatus 1 of the present embodiment provides novel decimation processing instead of the conventional decimation processing. The decimation processing according to the present embodiment will be described below in detail.

Returning to FIG. 5, in the step ST70, the amplitude map (m) generated in the step ST50 is decimated to generate a low-resolution amplitude map (M).

In the step ST80, the processing circuitry 40 performs TRW-S algorithm by using the low-resolution phase maps $\Phi_A$ and $\Phi_B$ (i.e., a decimated first phase maps $\Phi_A$ and a decimated second phase map $\Phi_B$) and the low-resolution amplitude map (M) so as to estimate the true phase $\Phi$ from the low-resolution phase maps $\Phi_A$ and $\Phi_B$, and generates a low-resolution estimated true phase map ($\Phi$). For the processing of the step ST80, for example, a known technique disclosed in Non-Patent Document 1 can be used.

Although a technique using the TRW-S algorithm is described here as a method of estimating the true phase $\Phi$ from the low-resolution phase maps $\Phi_A$ and $\Phi_B$ and generating a low-resolution estimated true phase map ($\Phi$), it is not limited to the TRW-S algorithm. The MRI apparatus 1 of the present embodiment can use a method other than the TRW-S algorithm as a method of estimating the true phase $\Phi$ from the low-resolution phase maps $\Phi_A$ and $\Phi_B$ and generating a low-resolution estimated true phase map ($\Phi$).

In the step ST90, the processing circuitry 40 performs smoothing processing on the estimated true phase map ($\Phi$) generated as a low-resolution map in the step ST80 so as to generate an estimated true phase map ($\varphi$), resolution of which is increased to the resolution of the original images (first and second images).

Finally, in the step ST100, each pixel value W of the water image and each pixel value F of the fat image are calculated by using the first and second images and the estimated true phase map ($\varphi$) on the basis of Expressions 16 to 20 below.

$$b_0 = \exp\left(j\angle \frac{S_1(1-a_2) - S_2(1-a_1)/b}{a_1 - a_2}\right) \quad \text{Expression 16}$$

$$S = A\begin{bmatrix} W \\ F \end{bmatrix} \quad \text{Expression 17}$$

$$S = \begin{bmatrix} \text{Re}(S_1/b_0) \\ \text{Im}(S_1/b_0) \\ \text{Re}(S_2/b_0 b) \\ \text{Im}(S_2/b_0 b) \end{bmatrix} \quad A = \begin{bmatrix} 1 & \text{Re}(a_1) \\ 0 & \text{Im}(a_1) \\ 1 & \text{Re}(a_2) \\ 0 & \text{Im}(a_2) \end{bmatrix} \quad \text{Expression 18}$$

$$\begin{bmatrix} W_{LS} \\ F_{LS} \end{bmatrix} = A^\dagger S \quad \text{Expression 19}$$

$$A^\dagger = (A^T A)^{-1} A^T \quad \text{Expression 20}$$

The symbol "b" in Expression 16 is the phase term ($b = \exp(j\phi)$) corresponding to the true phase $\varphi$ estimated by the TRW-S algorithm. The symbol "$W_{LS}$" in Expression 19 is the pixel value of the water image to be finally obtained, and $F_{LS}$ in Expression 19 is the pixel value of the fat image to be finally obtained. Expression 20 is an inverse matrix (i.e., Moore-Penrose inverse matrix) for minimizing the respective square errors of $W_{LS}$ and $F_{LS}$.

(Decimation Processing)

Hereinafter, a description will be given of the algorithm of the decimation processing in the present embodiment executed in the step ST80. The flow of the processing in the step ST60 is developed into a series of flowcharts consisting of FIG. 7, FIG. 9, FIG. 11, and FIG. 12. The algorithm of the decimation processing according to the present embodiment will be described according to the step numbers of the series of flowcharts.

Figure 7:
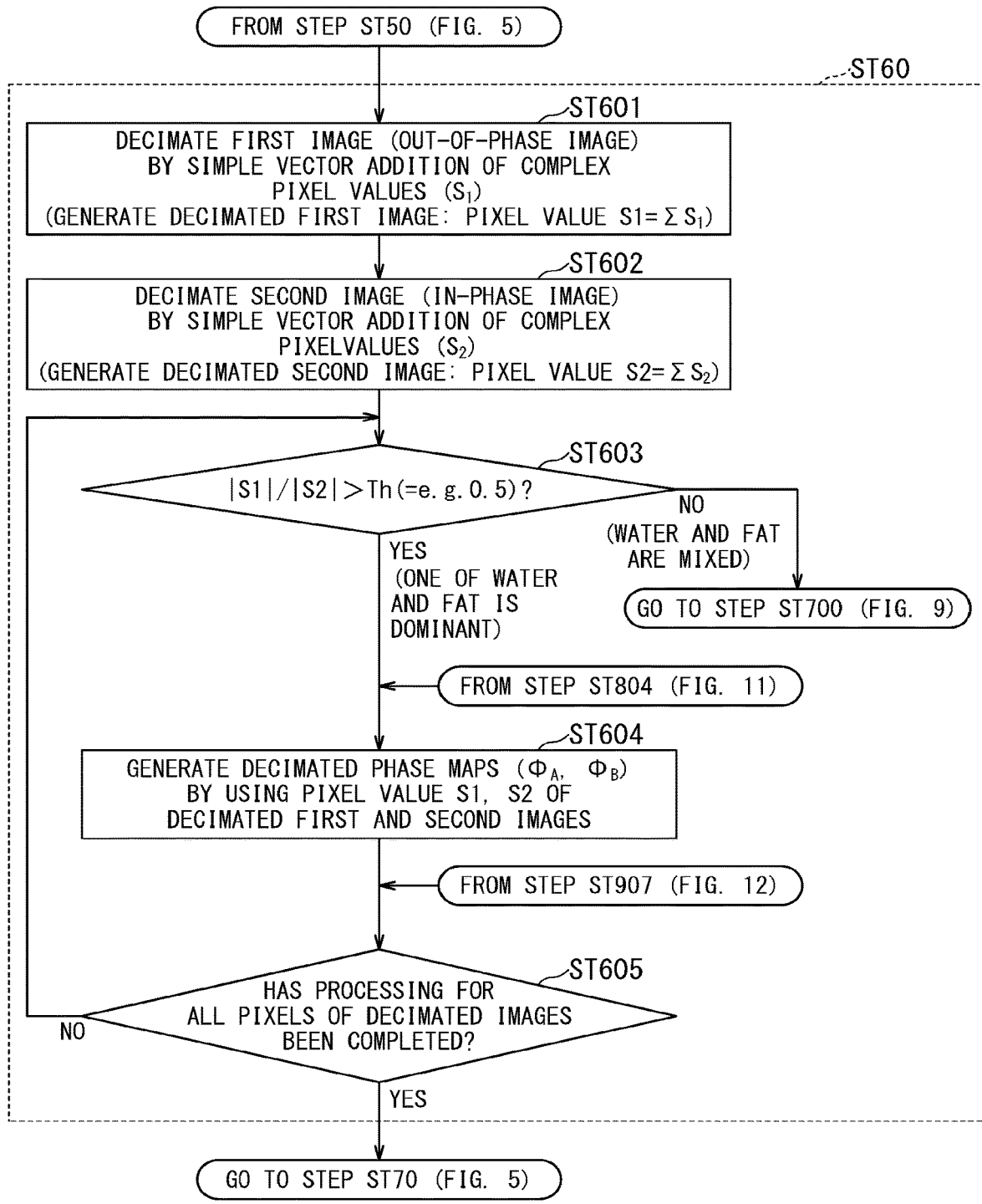
FIG. 7 is the beginning part of a flowchart for illustrating the processing of decimating the phase map according to the present embodiment, wherein the flowchart consists of four diagrams of FIG. 7, FIG. 9, FIG. 11, and FIG. 12.

In the step ST601 in FIG. 7, simple vector addition, i.e., simple addition of complex pixel values $S_1$, is performed on the complex pixel values $S_1$ of the first image (Out-of-Phase image) to generate a decimated first image. When each pixel value of the decimated first image is defined as S1, $S1 = \Sigma S_1$ is established.

Figure 8:
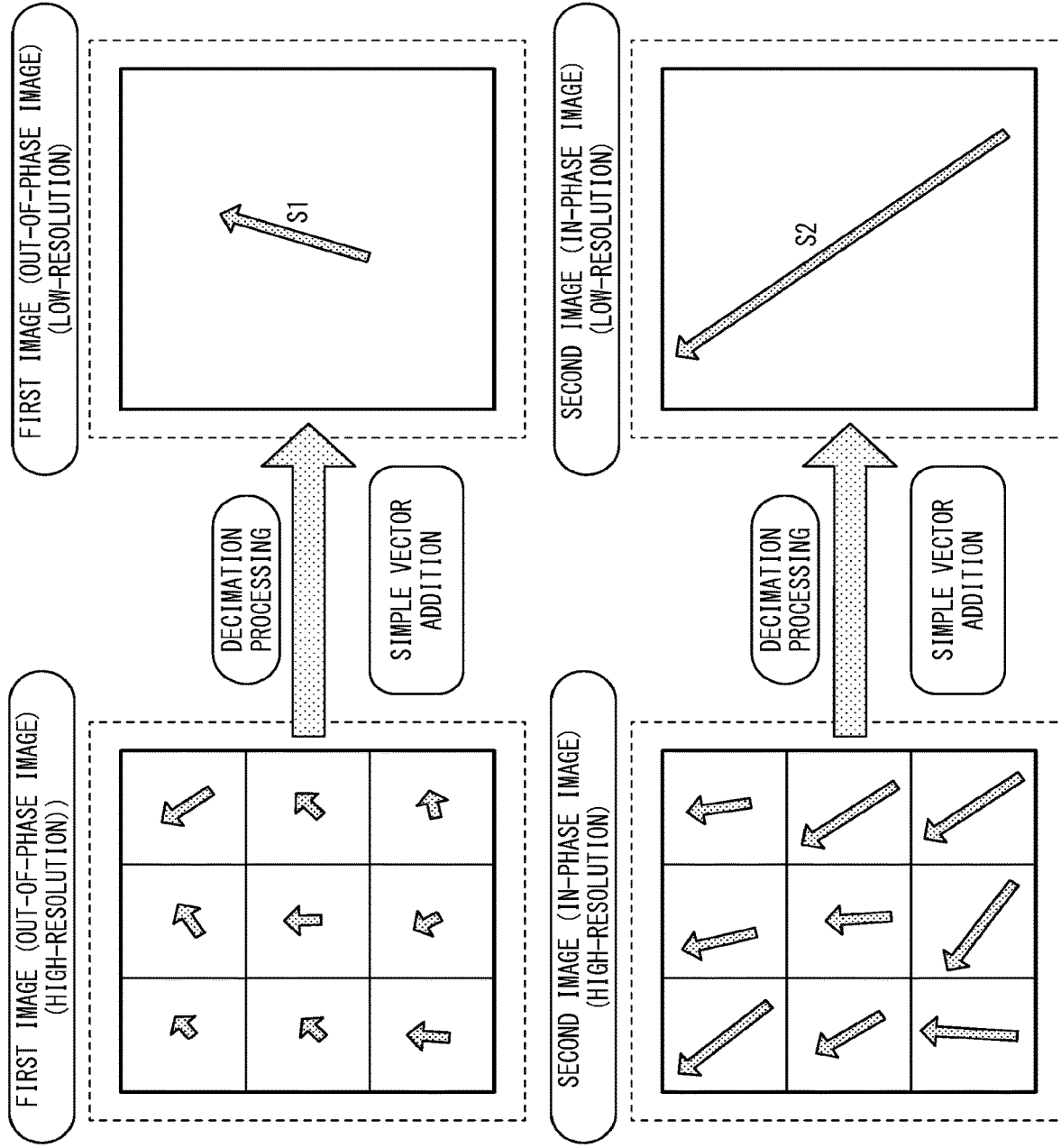
FIG. 8 is a schematic diagram for illustrating simple vector addition to be applied to pixel values of the first and second images.

Similarly, in the step ST602, simple vector addition is performed on the complex pixel values $S_2$ of the second image (In-Phase image) to generate a decimated second image. When each pixel value of the decimated second image is defined as S2, $S2 = \Sigma S_2$ is established. FIG. 8 is a schematic diagram illustrating the processing of the steps ST601 and ST602.

In the next step ST603, on the basis of the ratio between the amplitude |S1| and |S2|, it is estimated whether one of the water component and the fat component is dominant or not. Here, |S1| is an amplitude of the first summed pixel obtained by applying vector addition to pixels of the first image, and |S2| is an amplitude of the second summed pixel obtained by applying vector addition to pixels of the second image.

In the first summed pixel obtained by decimating the Out-of-Phase image (first image), the water component W and the fat component F have substantially opposite phases, whereas in the second summed pixel obtained by decimating the In-Phase image (second image), the water component W and the fat component F have substantially the same phase.

Thus, if the water component W and the fat component F are substantially the same in amount, the amplitude |S1| of the first summed pixel indicates a small value, while the amplitude |S2| of the second summed pixel indicates a large value. Hence, when the ratio |S1|/|S2| is smaller than a predetermined value (for example, smaller than 0.5), it can be determined that neither the water component nor the fat component is dominant, or it can be determined that the water component W and the fat component F are almost the same in amount. In this case, the processing proceeds to the step ST700 in FIG. 9.

If one of the water component and the fat component is dominant, the amplitude |S1| of the first summed pixel becomes close to the value of the dominant one of the water component and the fat component, and similarly, the amplitude |S2| of the second summed pixel becomes closer to the value of the dominant one of the water component and the fat component. Thus, the ratio between both, i.e., |S1|/|S2| becomes a value close to 1. Hence, if |S1|/|S2| is a value close to 1, for example, at least larger than 0.5, it can be determined that one of the water component and the fat component is dominant. In this case, the processing proceeds to the step ST604.

In the step ST604, the low-resolution phase $\Phi_A$ and the low-resolution phase $\Phi_B$ are calculated by using the respective pixel values S1 and S2 of the decimated first and second images so that the low-resolution phase map ($\Phi_A$) (i.e., the decimated first phase map ($\Phi_A$)) and low-resolution phase map ($\Phi_B$) (i.e., the decimated second phase map ($\Phi_B$)) are generated. As to the method for calculating the low-resolution phases $\Phi_A$ and $\Phi_B$ by using pixel values S1 and S2, the above-described method based on Expressions 1 to 14 for the pixels $S_1$ and $S_2$ of the first and second images before decimation may be applied in such a manner that the pixel values $S_1$ and $S_2$ of the first and second images before decimation are respectively replaced by the pixels S1 and S2 of the decimated first image and the decimated second image.

In the step ST605, if it is determined that the processing has been completed for all the pixels of the decimated images, generation of the low-resolution phase maps $\Phi_A$ and $\Phi_B$ has been completed, and thus, the processing returns to the step ST70 in FIG. 5.

In the step ST603, if it is determined that the water component W and the fat component F are almost the same in amount or it is determined that neither the water component nor the fat component is dominant, the decimated phase maps ($\Phi_A$) and ($\Phi_B$) are generated from the phase maps ($\varphi_A$) and ($\varphi_B$), which are phase maps before the decimation processing. In this case, the processing proceeds to the step ST700 in FIG. 9.

Figure 9:
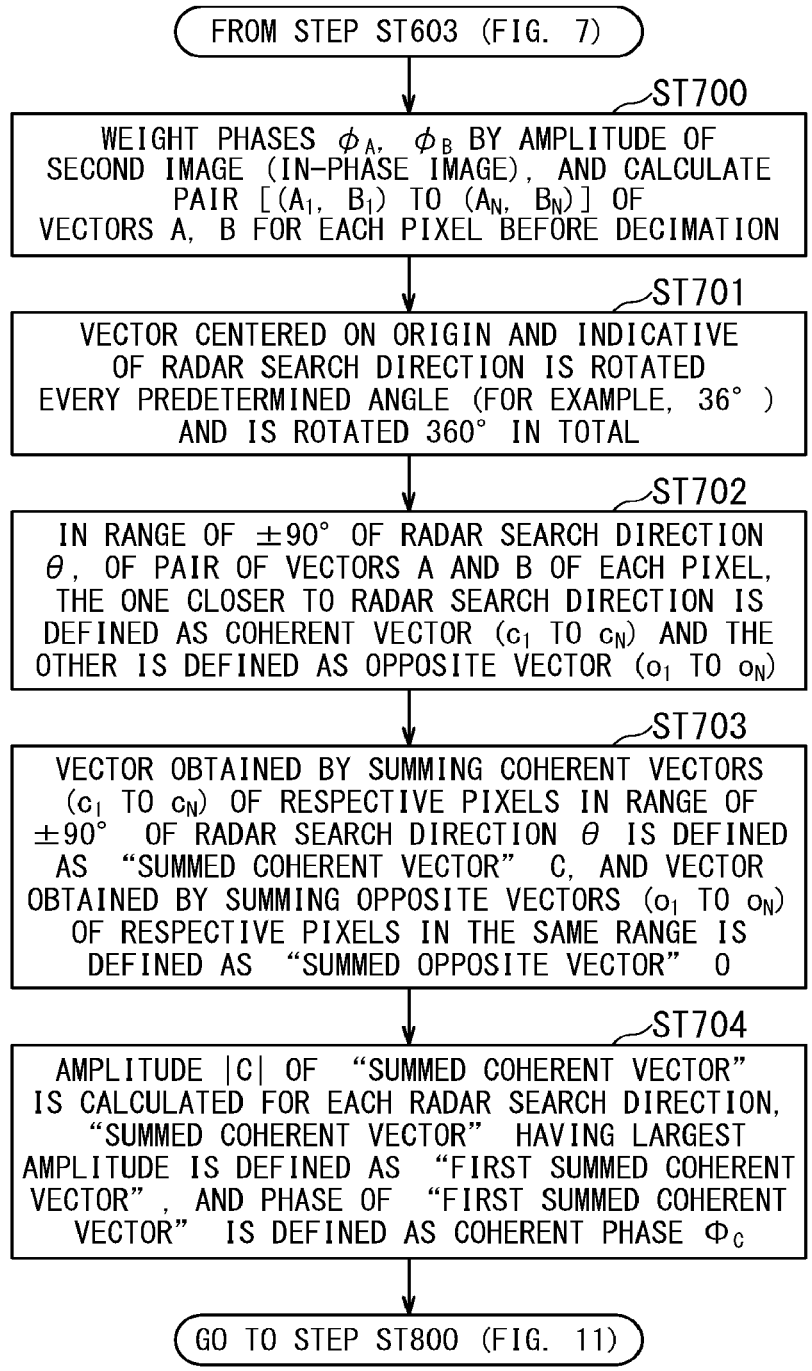
FIG. 9 is the second part (i.e., part subsequent to FIG. 7) of the flowchart for illustrating the processing of decimating the phase map according to the present embodiment.

In the step ST700 in FIG. 9, a pair of vectors A and B [($A_1$, $B_1$) to ($A_N$, $B_N$)] are calculated for each pixel before the decimation processing such that the vector A is obtained by weighting the phase $\varphi_A$ by the amplitude of the second image (In-Phase image) and the vector B is obtained by weighting the phase $\varphi_B$ by the amplitude of the second image. Here, N is the number of pixels to be decimated. That is, N pixels in the phase map before the decimation processing are converted to one pixel in the decimated phase map.

Figure 10:
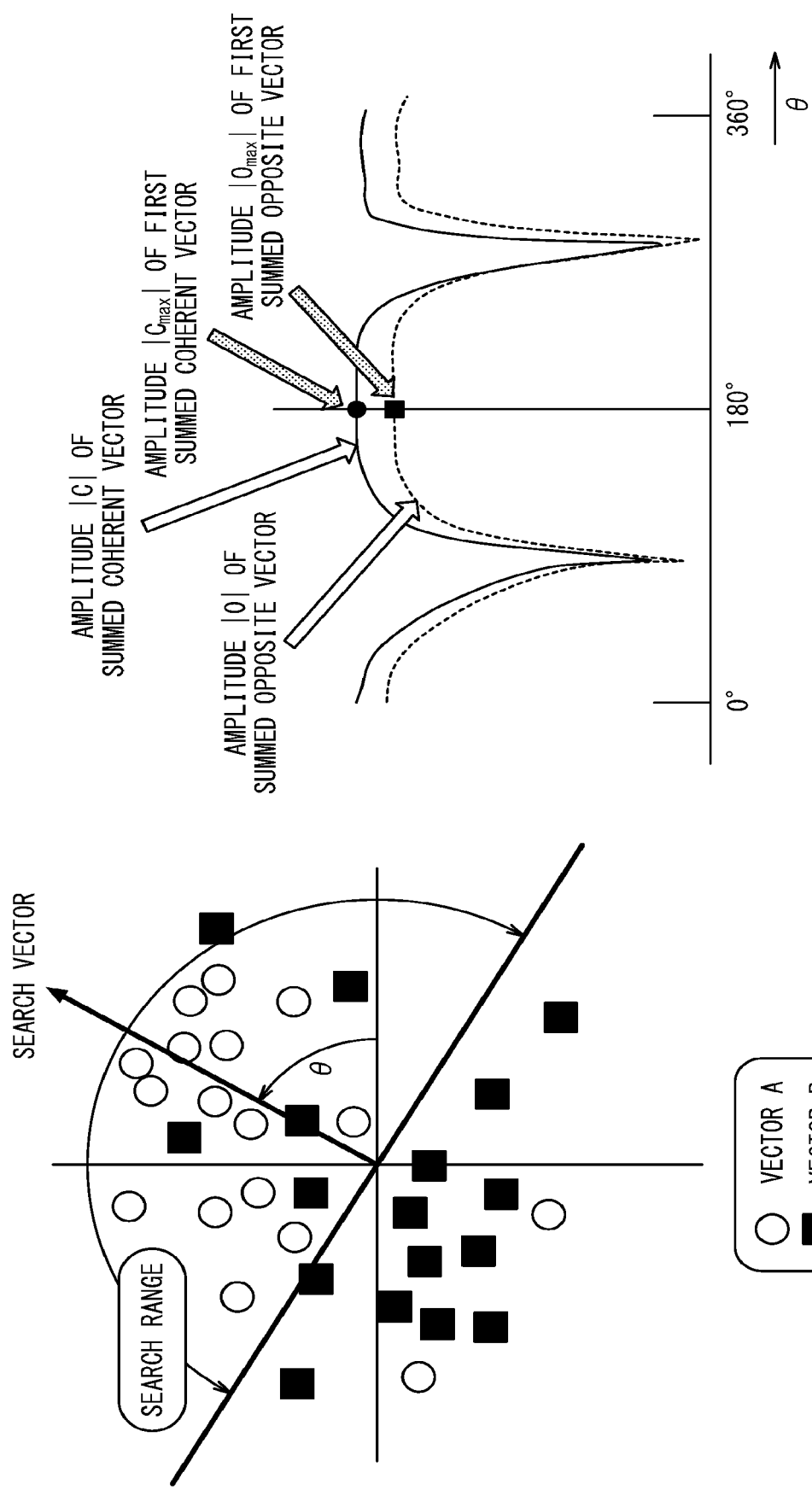
FIG. 10A is a schematic diagram in which the tips of a pair of vectors A and B are respectively plotted on a complex plane with a circle and a black square for each pixel that is before being subjected to decimation processing.
FIG. 10B is a schematic diagram in which the amplitude |C| of the summed coherent vector and the amplitude |O| of the summed opposite vector are plotted with respect to the radar search direction θ.

FIG. 10A is a schematic diagram in which the tips of the calculated vectors A and B are respectively plotted on a complex plane with a circle and a black square. In the case of FIG. 10A, both of the number of vectors A and the number of vectors B are 17 (N=17), and this case corresponds to resolution reduction in which all 17 pixels are decimated into one pixel. As described above, when a phase map having a resolution of 256×256×256 voxels is decimated into a phase map of 64×64×64 voxels, the number of vectors A and B, i.e., the number of white circles and black squares in FIG. 10A will become as large as 64 each, instead of 17.

In the next step ST701, as shown in FIG. 10A, a search vector, which is centered on the origin and indicative of the radar search direction, is rotated every predetermined angle (for example, 36°) and is rotated 360° in total.

In the next step ST702, of the pair of vectors A and B for each pixel in the phase map before the decimation, either one (i.e., either vector A or B) closer to the radar search direction within a predetermined range centered on the radar search direction θ (for example, within the range of θ±90°) is defined as a Coherent vector $c_n$ (n=1 to N), and the other one (i.e., vector A or B which is not defined as the coherent vector) is defined as an Opposite vector $o_n$ (n=1 to N).

In the next step ST703, a vector obtained by summing the Coherent vectors ($c_1$ to $c_N$) in the respective pixels in a range of ±90° of the radar search direction θ is defined as a "summed Coherent vector" C, and a vector obtained by summing the Opposite vectors ($o_1$ to $o_N$) in the respective pixels in the range of ±90° of the radar search direction θ is defined as a "summed Opposite vector" O.

In the next step ST704, the amplitude |C| of the summed Coherent vector is calculated for each radar search direction, then, the summed Coherent vector having the largest amplitude is defined as the "first summed Coherent vector", and then, the phase of the first summed Coherent vector is defined as the Coherent phase $\Phi_C$.

In the graph shown in FIG. 10B, the solid line indicates plots of the amplitude |C| of the summed Coherent vectors with respect to the radar search direction θ, and the maximum value $|C_{max}|$ of the amplitude |C| of the summed Coherent vectors, which correspond to the amplitude of the "first summed Coherent vector", is indicated by a black circle. In the graph shown in FIG. 10B, the broken line indicates plots of the amplitude |O| of the summed Opposite vectors with respect to the radar search direction θ, and the maximum value $|O_{max}|$ of the amplitudes |O| of the summed Opposite vectors, which correspond to the amplitude of the "first summed Opposite vector", is indicated by a black square.

Figure 11:
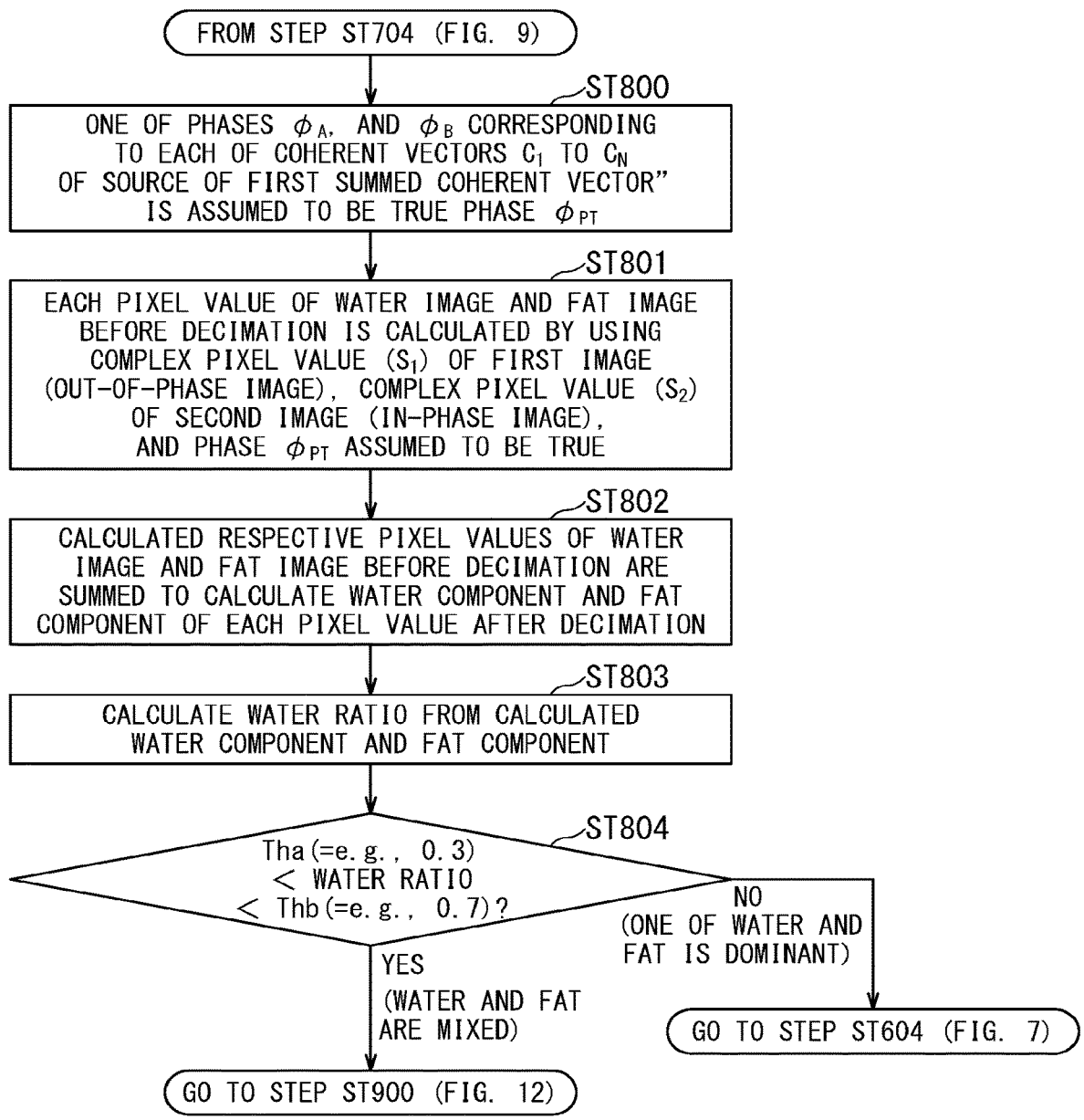
FIG. 11 is the third part (i.e., part subsequent to FIG. 9) of the flowchart for illustrating the processing of decimating the phase map according to the present embodiment.
Figure 12:
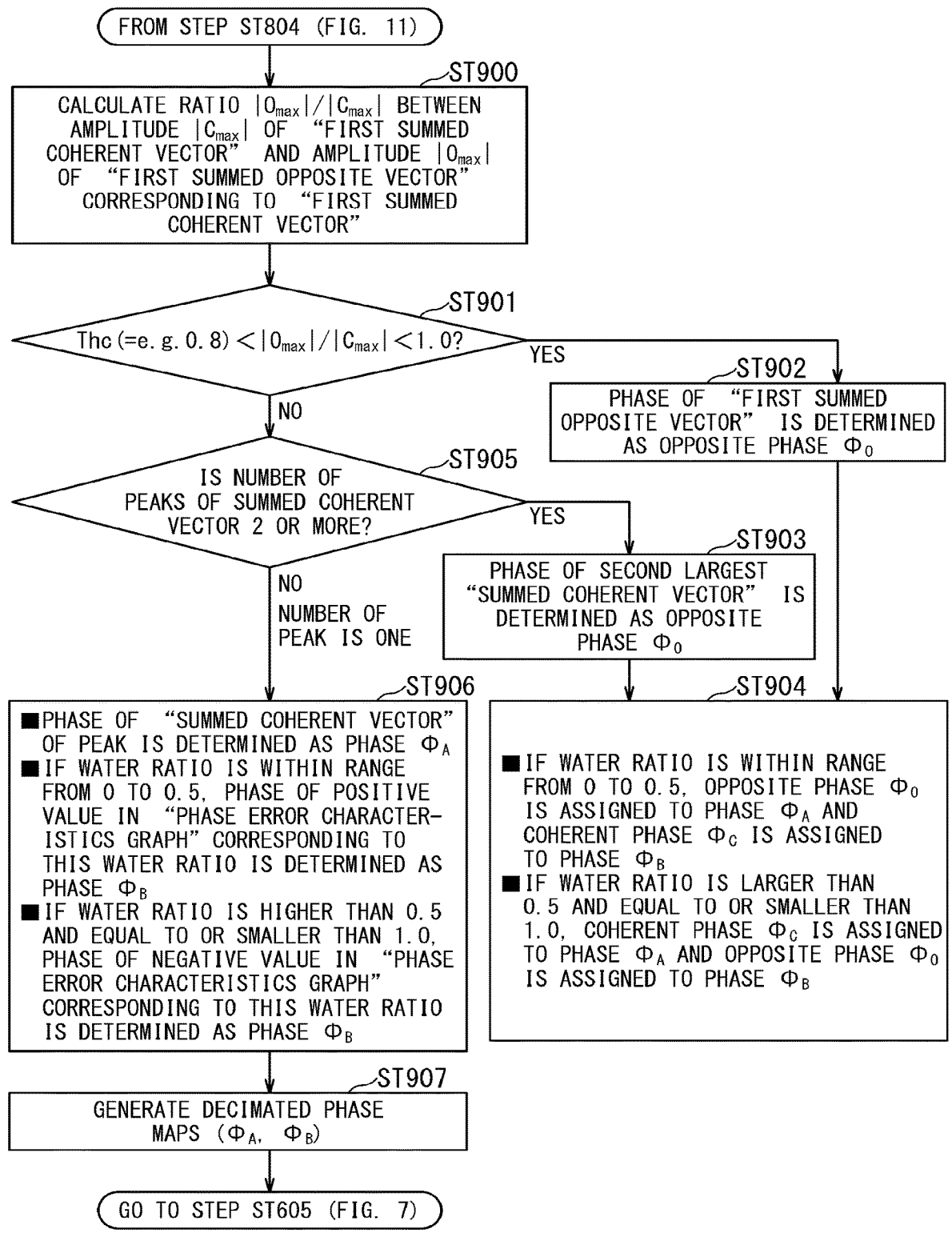
FIG. 12 is the final part (i.e., part subsequent to FIG. 11) of the flowchart for illustrating the processing of decimating the phase map according to the present embodiment.

Next, in the step ST800 in FIG. 11, one of the phases $\varphi_A$ and $\varphi_B$ corresponding to each of the Coherent vectors $c_1$ to $c_N$ of the source of the first summed coherent vector is assumed to be the true phase $\varphi_{PT}$.

In the next step ST801, each pixel value of the water image before decimation and each pixel value of the fat image before decimation are calculated by using the complex pixel value ($S_1$) of the first image (Out-of-Phase image) before decimation, the complex pixel value ($S_2$) of the second image (In-Phase image) before decimation, and the phase $\varphi_{PT}$ assumed to be true. This calculation is executed on the basis of the Expressions 16 to 20.

In the next step ST802, vector-summation is applied to the calculated pixel values of the water image before decimation and the calculated pixel values of the fat image before decimation, and thereby the water component and the fat component of each pixel value after the decimation is calculated.

In the next step ST803, the water ratio is calculated from the calculated water component and fat component.

As described above, in the present embodiment, a plurality of substances having different magnetic resonance frequencies can be processed, without being limited to the water component and the fat component. In this case, instead of calculating the water ratio, the component ratio of the plurality of substances is calculated. However, also in this case, it is not necessary to calculate the component ratio of the substance itself, but it is sufficient to obtain information related to the component ratio of the substance, and the term "water ratio" in the following description can be replaced with "information related to the component ratio of a substance."

In the next step ST804, branch determination is performed on the basis of the water ratio. That is, if the water ratio is outside a predetermined range centered at 0.5, it is estimated that one of the water component and the fat component is dominant. For example, if the calculated water ratio is outside the range of 0.3 to 0.7, it is estimated that one of the water component and the fat component is dominant. In this case, the processing returns to the step ST604 in FIG. 7.

Conversely, if the calculated water ratio is inside the predetermined range centered at 0.5 (for example, range of 0.3 to 0.7), it is estimated that the water component and the fat component are mixed at approximately the same amount. In this case, the processing proceeds to the step ST900 in FIG. 12.

In the step ST900, the ratio $|O_{max}|/|C_{max}|$, i.e., the ratio between the amplitude $|C_{max}|$ of the first summed Coherent vector and the amplitude $|O_{max}|$ of the first summed Opposite vector, which corresponds to the first summed coherent vector, is calculated.

In the next step ST901, it is determined whether the difference between the amplitude $|C_{max}|$ and the amplitude $|O_{max}|$ is small enough to bring the ratio $|O_{max}|/|C_{max}|$ to a large value close to 1 or not. For example, if the ratio $|O_{max}|/|C_{max}|$ is larger than a predetermined threshold (for example, 0.8) and equal to or smaller than 1, the determination result is affirmative and the processing proceeds to the step ST902 in which the phase of the first summed Opposite vector is determined as the Opposite phase $\Phi_o$.

FIG. 13A is a schematic diagram illustrating the amplitude $|C|$ of the summed Coherent vector and the amplitude $|O|$ of the summed Opposite vector when the ratio $|O_{max}|/|C_{max}|$ between the amplitude $|C_{max}|$ of the first summed Coherent vector and the amplitude $|O_{max}|$ of the first summed Opposite vector indicates a large value close to 1. In this case, the phase of the first summed Coherent vector is determined as the Coherent phase $\varphi_c$ (in the step ST704 in FIG. 9), and the phase of the first summed Opposite vector is determined as the Opposite phase $\varphi_o$.

If it is determined in the step ST901 that ratio $|O_{max}|/|C_{max}|$ is smaller than the predetermined threshold (for example, 0.8), the processing proceeds to the step ST905. In the step St905, it is determined whether there are two or more peaks of the summed Coherent vector or not.

FIG. 13B is a schematic diagram illustrating the amplitude $|C|$ of the summed Coherent vector and the amplitude 101 of the summed Opposite vector when the ratio $|O_{max}|/|C_{max}|$ is determined to be smaller than the predetermined value and the number of peaks of the summed Coherent vector is determined to be two or more. If there are two or more peaks in the summed Coherent vector, the phase of the second largest summed Coherent vector is determined as the Opposite phase $\Phi_0$.

The Coherent phase $\Phi_c$ has already been determined in the step ST704 of FIG. 9. Further, in the steps ST902 and ST903, the Opposite phase $\Phi_0$ is determined. In this case, in the next step ST904, the Coherent phase $\Phi_c$ and the Opposite phase $\Phi_0$ are assigned to the phase $\Phi_A$ and the phase $\Phi_B$ on the basis of the value of the water ratio calculated in the step ST803.

Specifically, when the water ratio is within a range from 0 to 0.5, the Opposite phase $\Phi_0$ is assigned to the phase $\Phi_A$ and the Coherent phase $\Phi_c$ is assigned to the phase $\Phi_B$. On the other hand, when the water ratio is larger than 0.5 and equal to or smaller than 1.0, the Coherent phase $\Phi_c$ is assigned to the phase $\Phi_A$ and the Opposite phase $\Phi_0$ is assigned to the phase $\Phi_B$. In this manner, the phases $\Phi_A$ and $\Phi_B$ of each pixel of the decimated phase map are determined.

If it is determined in the step ST901 that the ratio $|O_{max}|/|C_{max}|$ is smaller than the predetermined value and it is determined in the step ST905 that the number of peaks of the summed coherent vector is one, the processing proceeds to the step ST906.

Figure 14B:
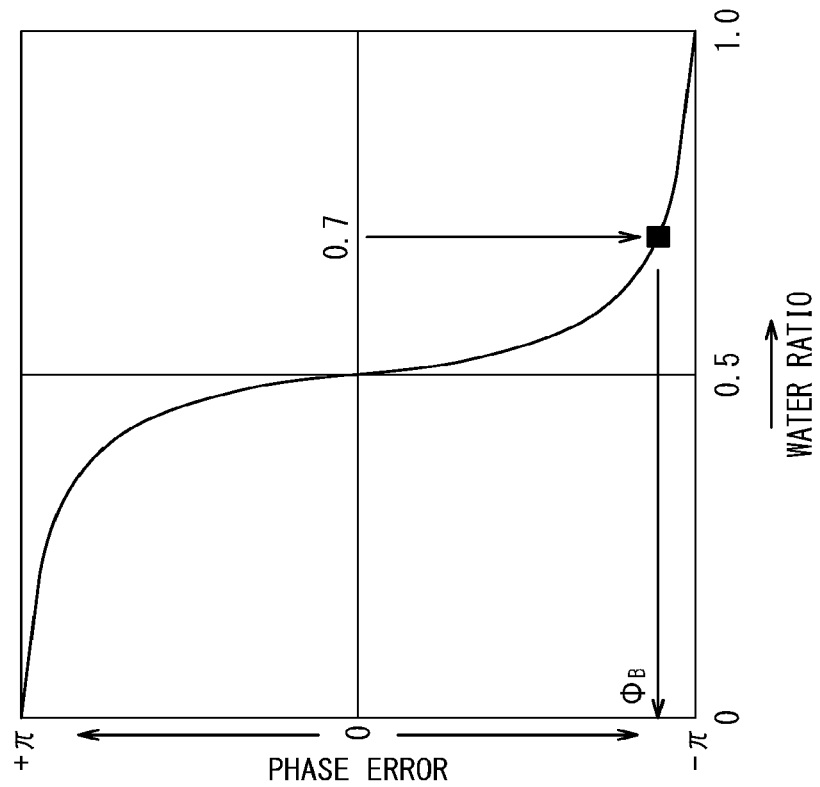
FIG. 14B is a graph illustrating phase error characteristics in which relationship between a water ratio and a phase error is defined.
Figure 14A:
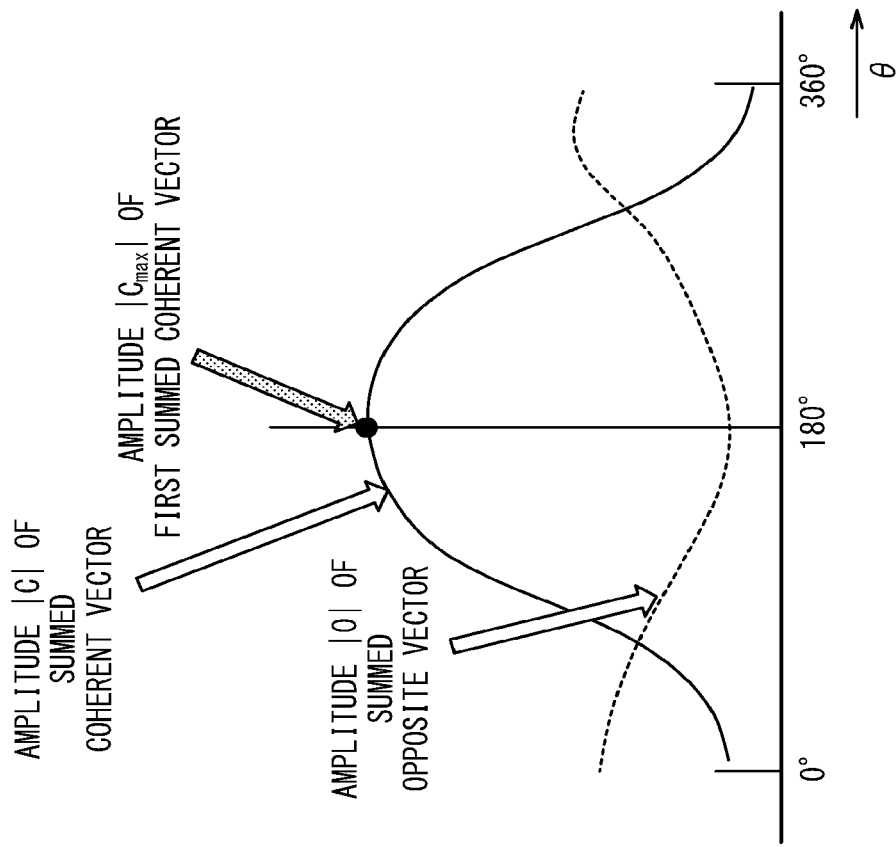
FIG. 14A is a schematic diagram illustrating the amplitude |C| of the summed coherent vector and the amplitude |O| of the summed opposite vector when the number of peak of the amplitude |C| of the combined coherent vector is one.

FIG. 14A and FIG. 14B are schematic diagrams illustrating the concept of the processing in the step ST906. In detail, FIG. 14A is a schematic diagram illustrating the amplitude $|C|$ of the summed Coherent vector and the amplitude $|O|$ of the summed Opposite vector when the number of peak of the amplitude $|C|$ of the summed Coherent vector is one. Additionally, FIG. 14B is a graph illustrating phase error characteristics in which relationship between a water ratio and a phase error is defined.

In the step ST906, first, the phase of the summed Coherent vector of the peak is determined as the phase $\Phi_A$. Next, referring to the water ratio calculated in the step ST803, if the water ratio is within the range from 0 to 0.5, the phase of a positive value in the phase-error characteristics graph corresponding to this water ratio is determined as the phase $\Phi_B$. On the other hand, if the water ratio is within the range from 0.5 to 1.0, the phase of a negative value in the phase-error characteristics graph corresponding to this water ratio is determined as the phase $\Phi_B$. For example, if the water ratio is 0.7, the value (negative value) of the phase $\Phi_B$ corresponding to the water ratio 0.7 is acquired from the phase-error characteristics graph, and the acquired value is determined as the phase $\Phi_B$, as shown in FIG. 14B.

As described above, in the MRI apparatus 1 of the present embodiment, the phases $\Phi_A$ and $\Phi_B$ of the pixels after decimation are obtained by using the phases $\varphi_A$ and $\varphi_B$ of all the pixels before the decimation processing. Thus, erroneous estimation of the phases $\Phi_A$ and $\Phi_B$ after the decimation processing can be reduced, and therefore, the water-component region and the fat-component region in each of the water image and the fat image can be estimated more accurately with less errors.

When either the water component or the fat component is dominant, instead of decimating the phase maps ($\varphi_A$) and ($\varphi_B$), simple vector addition is applied to the respective pixel values of the first and second images to generate the decimated (i.e., the low-resolution) first and second images. Then, low-resolution phase maps ($\Phi_A$) and ($\Phi_B$) are calculated from the pixel values S1 and S2 of the decimated first and second images. Accordingly, the processing of decimating the phase maps becomes unnecessary, and the phases $\Phi_A$ and $\Phi_B$ after the decimation can be calculated with less errors, and thus, the water-component region and the fat-component region in each of the water image and the fat image can be estimated more accurately with less errors.

(Image Processing Apparatus)

Figure 15:
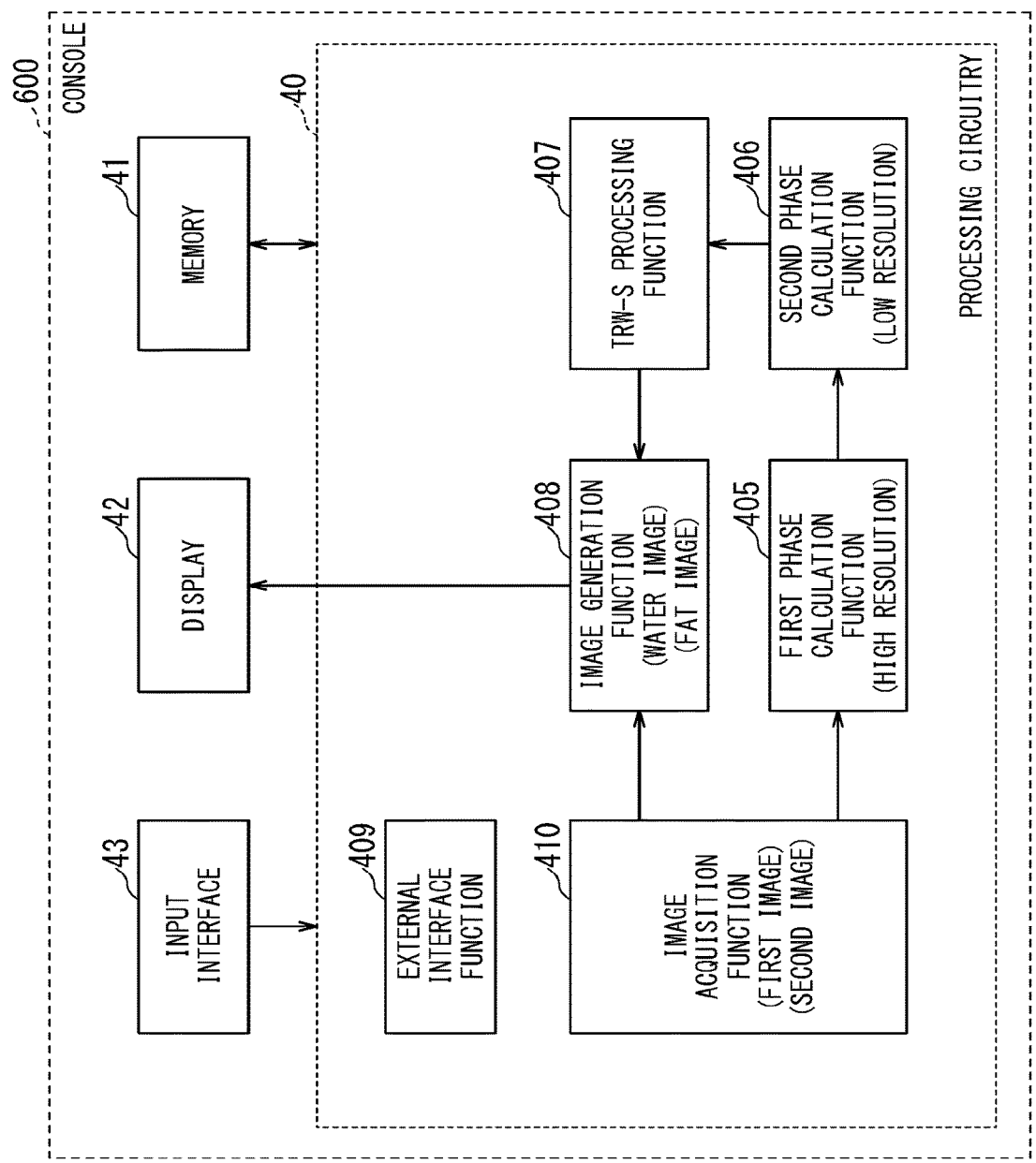
FIG. 15 is a schematic diagram illustrating a configuration of an image processing apparatus according to one embodiment.

FIG. 15 is a block diagram illustrating a configuration of an image processing apparatus 600 according to one embodiment. The image processing apparatus 600 is an apparatus that performs most of the functions of the console 400 of the MRI apparatus 1, by an information processing apparatus such as a workstation, a personal computer, or a tablet computer, which is independent from the MRI apparatus 1.

The first image and the second image described above are generated by the MRI apparatus 1. In the image processing apparatus 600, the first image and the second image generated by the MRI apparatus 1 are acquired (or, are inputted) via an arbitrary recording medium or an arbitrary communication line by the external interface function 409 and the image acquisition function 410 shown in FIG. 15. The image processing apparatus 600 includes the processing circuitry 40 similarly to the console 400 of the MRI apparatus 1.

The processing circuitry 40 implements the first-phase calculation function 405, the second-phase calculation function 406, the TRW-S processing function 407, and the image generation function 408 in addition to the image acquisition function 410 described above. These functions of the processing circuitry 40 of the image processing apparatus 600 are the same as the functions of the MRI apparatus 1 described above. The processing circuitry 40 implements each of these functions by, for example, causing the processor included in the processing circuitry 40 to execute predetermined programs stored in the memory 41.

Even with such an image processing apparatus 600, the same effects as those of the above-described MRI apparatus 1 can be obtained.

According to at least one embodiment described above, in the technique of separating a water image and a fat image, a water-component region and a fat-component region can be estimated more accurately with less errors.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus comprising:
a scanner configured to acquire a plurality of magnetic resonance (MR) signals at respective different echo times from an imaging region of an object, the imaging region including a plurality of substances that are different in magnetic resonance frequency from each other; and
processing circuitry configured to:
calculate at least one phase map from the plurality of MR signals, the at least one phase map including information on phase rotation amount due to non-uniformity of a static magnetic field, and
generate an image by using the at least one phase map and the plurality of MR signals in such a manner that a signal from at least one of the plurality of substances is suppressed in the image,
wherein the processing circuitry is further configured to:
estimate whether one of a water component and a fat component is dominant or not in the imaging region, and
determine, based on an estimation result, whether or not to generate at least one decimated phase map by performing decimation processing on the at least one phase map calculated from the plurality of MR signals.

2. An image processing apparatus comprising processing circuitry configured to:
input a plurality of complex images generated from a plurality of magnetic resonance (MR) signals that are acquired at respective different echo times from an imaging region of an object, the imaging region including a plurality of substances that are different in magnetic resonance frequency from each other;
calculate at least one phase map from the plurality of complex images, the at least one phase map including information on phase rotation amount due to non-uniformity of a static magnetic field; and
generate an image by using the at least one phase map and the plurality of MR signals in such a manner that a signal from at least one of the plurality of substances is suppressed in the image,
wherein the processing circuitry is further configured to:
estimate whether one of a water component and a fat component is dominant or not in the imaging region, and
determine, based on an estimation result, whether or not to generate at least one decimated phase map by performing decimation processing on the at least one phase map calculated from the plurality of MR signals.

3. An image processing method comprising:
inputting a plurality of complex images generated from a plurality of magnetic resonance (MR) signals that are acquired at respective different echo times from an imaging region of an object, the imaging region including a plurality of substances that are different in magnetic resonance frequency from each other;
calculating at least one phase map from the plurality of complex images, the at least one phase map including information on phase rotation amount due to non-uniformity of a static magnetic field, and
generating an image by using the at least one phase map and the plurality of MR signals in such a manner that a signal from at least one of the plurality of substances is suppressed in the image;
estimating whether one of a water component and a fat component is dominant or not in the imaging region; and
determining, based on an estimation result, whether or not to generate at least one decimated phase map by performing decimation processing on the at least one phase map calculated from the plurality of MR signals.

4. The MM apparatus according to claim 1, wherein:
the processing circuitry is further configured to
reconstruct a first image from MR signals acquired at a first echo time, the first image having a first resolution,
reconstruct a second image from MR signals acquired at a second echo time, the second image having the first resolution,
calculate first phases and second phases from the first image and the second image, respectively,
generate a first phase map by arraying the first phases, the first phase map having the first resolution,
generate a second phase map by arraying the second phases, the second phase map having the first resolution,
estimate whether one of the water component and the fat component is dominant or not for each pixel in the imaging region,
calculate, when one of the water component and the fat component is estimated to be dominant, a decimated first phase map and a decimated second phase map as the at least one decimated phase map from each pixel value of a decimated first image and a decimated second image, respectively, wherein the decimated first and second images are generated by decimating the first and second images, respectively, and
calculate, when neither the water component nor the fat component is estimated to be dominant, the decimated first phase map and the decimated second phase map from each phase value of the first phase map and the second phase map, respectively.

5. The MRI apparatus according to claim 1, wherein the processing circuitry is configured to:
reconstruct a first image from MR signals acquired at a first echo time, the first image having a first resolution;
reconstruct a second image from MR signals acquired at a second echo time, the second image having the first resolution;
calculate first phases and second phases from the first image and the second image;

generate a first phase map by arraying the first phases, the first phase map having the first resolution;
generate a second phase map by arraying the second phases, the second phase map having the first resolution;
generate a decimated first phase map and a decimated second phase map in such a manner that each of the decimated first phase map and the decimated second phase map has second resolution lower than the first resolution;
estimate true phase distribution from the decimated first phase map and the decimated second phase map, the true phase distribution corresponding to distribution of the static magnetic field at an imaging time of the object; and
generate a water image and a fat image by using the first image, the second image, and the true phase distribution.

6. The MM apparatus according to claim 5, wherein the processing circuitry is configured to:
generate a decimated first image and a decimated second image, by decimating the first image and the second image, respectively, both of the decimated first image and the decimated second image having the second resolution;
estimate whether one of a water component and a fat component is dominant or not, based on each pixel value of the decimated first image and the decimated second image;
calculate the decimated first phase map and the decimated second phase map from each pixel value of the decimated first image and the decimated second image, when one of the water component and the fat component is estimated to be dominant; and
calculate the decimated first phase map and the decimated second phase map from each phase value of the first phase map and the second phase map, when neither the water component nor the fat component is estimated to be dominant.

7. The MRI apparatus according to claim 6, wherein the processing circuitry is configured to estimate whether one of the water component and the fat component is dominant or not, based on a ratio between an amplitude of a first summed pixel obtained by performing vector addition on a plurality of pixels of the first image and an amplitude of a second summed pixel obtained by performing vector addition on a plurality of pixels of the second image.

8. The MRI apparatus according to claim 7, wherein the processing circuitry is configured to:
reconstruct the first image as an Out-of-Phase image;
reconstruct the second image as an In-Phase image; and
estimate that one of the water component and the fat component is dominant when a ratio of an amplitude of the first summed pixel to an amplitude of the second summed pixel is larger than a predetermined threshold.

9. The MRI apparatus according to claim 6, wherein the processing circuitry is configured to:
calculate a water ratio from each pixel value of the decimated first image and decimated second image; and
estimate whether one of the water component and the fat component is dominant or not, based on the water ratio.

10. The MRI apparatus according to claim 9, wherein the processing circuitry is configured to:
make an assumption that one of the first phase in the first phase map and the second phase in the second phase map is a true phase corresponding to distribution of the static magnetic field at an imaging time of the object;
calculate the water ratio by using (a) respective pixel values of the first image and the second image and (b) one of the first phase and the second phase assumed to be true in the assumption; and
estimate that one of the water component and the fat component is dominant, when the water ratio is outside a predetermined range centered on 0.5.

11. The MRI apparatus according to claim 6, wherein, in a case of estimating that neither the water component nor the fat component is dominant, the processing circuitry is configured to:
(a) calculate a plurality of first vectors and a plurality of second vectors by weighting each of the first phases and the second phases by an amplitude of one of the first image and the second image;
(b) classify the plurality of first vectors and the plurality of second vectors in a predetermined range centered on a search direction angle into a plurality of coherent vectors and a plurality of opposite vectors, based on respective angles of the first and second vectors from the search direction angle;
(c) generate a summed coherent vector by summing the plurality of coherent vectors while changing the search angle direction in a search range from 0° to 360°;
(d) generate a summed opposite vector by summing the plurality of opposite vectors while changing the search angle direction in the search range from 0° to 360°; and
(e) calculate the decimated first phase map and the decimated second phase map by using a phase of the summed coherent vector or a phase of the summed opposite vector.

12. The MRI apparatus according to claim 11, wherein the processing circuitry is configured to:
make an assumption that a phase of the coherent vector is a true phase corresponding to distribution of the static magnetic field at an imaging time of the object; and
calculate a water ratio by using the true phase in the assumption and respective pixel values of the first image and the second image.

13. The MRI apparatus according to claim 12, wherein, in a case where a ratio of an amplitude of the summed opposite vector to an amplitude of the summed coherent vector is 1 or less and is equal to or more than a predetermined value close to 1, the processing circuitry is configured to
(a) when the water ratio is within a range from 0 to 0.5, generate the decimated second phase map by using a phase of the summed coherent vector, an amplitude of which shows a largest value in the search range, while generating the decimated first phase map by using a phase of the summed opposite vector, and
(b) when the water ratio is larger than 0.5 and equal to or smaller than 1.0, generate the decimated first phase map by using a phase of the summed coherent vector, an amplitude of which shows a largest value in the search range, while generating the decimated second phase map by using a phase of the summed opposite vector.

14. The MRI apparatus according to claim 12, wherein, in a case where a ratio of an amplitude of the summed opposite vector to an amplitude of the summed coherent vector is a predetermined value or less, and number of peaks of the amplitude of the summed coherent vector is two or more within the search range, the processing circuitry is configured to
(a) when the water ratio is within a range from 0 to 0.5, generate the decimated second phase map by using a phase of the summed coherent vector, an amplitude of which shows a largest value in the search range, while generating the decimated first phase map by using a phase of the summed coherent vector, the amplitude of which shows a second largest value in the search range, and (b) when the water ratio is larger than 0.5 and equal to or smaller than 1.0, generate the decimated first phase map by using a phase of the summed coherent vector, an amplitude of which shows a largest value in the search range, while generating the decimated second phase map by using a phase of the summed coherent vector, the amplitude of which shows a second largest value in the search range.

15. The MRI apparatus according to claim 12, wherein, in a case where a ratio of an amplitude of the summed opposite vector to an amplitude of the summed coherent vector is a predetermined value or less, and only one peak of the amplitude of the summed coherent vector is included in the search range, the processing circuitry is configured to (a) when the water ratio is within a range from 0 to 0.5, generate the decimated first phase map by using a phase of the summed coherent vector corresponding to the one peak, refer to phase error characteristics that define relationship between the water ratio and a phase error, and generate the decimated second phase map by using a positive phase error associated with the water ratio in the phase error characteristics, and (b) when the water ratio is larger than 0.5 and equal to or smaller than 1.0, generate the decimated first phase map by using a phase of the summed coherent vector corresponding to the one peak, and further generate the decimated second phase map by using a negative phase error associated with the water ratio in the phase error characteristics.

16. The MRI apparatus according to claim 5, wherein the processing circuitry is configured to estimate a true phase corresponding to distribution of the static magnetic field at an imaging time of the object by using TRW-S (sequential tree-reweighted message-passing) algorithm.

17. The image processing apparatus according to claim 2, wherein:
the processing circuitry is further configured to:
reconstruct a first image from MR signals acquired at a first echo time, the first image having a first resolution,
reconstruct a second image from MR signals acquired at a second echo time, the second image having the first resolution,
calculate first phases and second phases from the first image and the second image, respectively,
generate a first phase map by arraying the first phases, the first phase map having the first resolution,
generate a second phase map by arraying the second phases, the second phase map having the first resolution,
estimate whether one of the water component and the fat component is dominant or not for each pixel in the imaging region,
calculate, when one of the water component and the fat component is estimated to be dominant, a decimated first phase map and a decimated second phase map as the at least one decimated phase map from each pixel value of a decimated first image and a decimated second image, respectively, wherein the decimated first and second images are generated by decimating the first and second images, respectively, and
calculate, when neither the water component nor the fat component is estimated to be dominant, the decimated first phase map and the decimated second phase map from each phase value of the first phase map and the second phase map, respectively.

18. The image processing method according to claim 3, comprising:
reconstructing a first image from MR signals acquired at a first echo time, the first image having a first resolution;
reconstructing a second image from MR signals acquired at a second echo time, the second image having the first resolution;
calculating first phases and second phases from the first image and the second image, respectively;
generating a first phase map by arraying the first phases, the first phase map having the first resolution;
generating a second phase map by arraying the second phases, the second phase map having the first resolution;
estimating whether one of the water component and the fat component is dominant or not for each pixel in the imaging region;
calculating, when one of the water component and the fat component is estimated to be dominant, a decimated first phase map and a decimated second phase map as the at least one decimated phase map from each pixel value of a decimated first image and a decimated second image, respectively, wherein the decimated first and second images are generated by decimating the first and second images, respectively; and
calculating, when neither the water component nor the fat component is estimated to be dominant, the decimated first phase map and the decimated second phase map from each phase value of the first phase map and the second phase map, respectively.

* * * * *